United States Patent [19]

Hattori

[11] Patent Number: 6,071,674
[45] Date of Patent: Jun. 6, 2000

[54] IMAGE FORMING MATERIAL AND IMAGE FORMING METHOD

[75] Inventor: Ryoji Hattori, Hino, Japan

[73] Assignee: Konica Corporation, Tokyo, Japan

[21] Appl. No.: 09/080,788

[22] Filed: May 18, 1998

[30] Foreign Application Priority Data

Jun. 13, 1997 [JP] Japan .................................... 9-156828
Nov. 13, 1997 [JP] Japan .................................... 9-311928

[51] Int. Cl.$^7$ .............................. G03F 7/004; G03F 7/09; G03F 7/11
[52] U.S. Cl. .................................... 430/278.1; 430/276.1; 430/160; 430/158; 430/944
[58] Field of Search ............................. 430/278.1, 276.1, 430/160, 158, 944

[56] References Cited

U.S. PATENT DOCUMENTS

| | | | |
|---|---|---|---|
| 3,891,516 | 6/1975 | Chu | 204/33 |
| 4,708,925 | 11/1987 | Newman | 430/326 |
| 4,746,591 | 5/1988 | Sakaki et al. | 430/168 |
| 4,824,535 | 4/1989 | Pliefke et al. | 204/129.75 |
| 5,085,972 | 2/1992 | Vogel | 430/270.1 |
| 5,104,484 | 4/1992 | Nakanishi et al. | 156/651 |
| 5,340,699 | 8/1994 | Haley et al. | |
| 5,364,738 | 11/1994 | Kondo et al. | 430/283.1 |
| 5,814,431 | 9/1998 | Nagasaka et al. | 430/281.1 |

FOREIGN PATENT DOCUMENTS

| | | |
|---|---|---|
| 0 589 309 A1 | 3/1994 | European Pat. Off. . |
| 0 784 233 A1 | 7/1997 | European Pat. Off. . |
| 795 789 A1 | 9/1997 | European Pat. Off. . |
| 0 823 659 A1 | 2/1998 | European Pat. Off. . |

OTHER PUBLICATIONS

Registry No. 23178–67–8, Registry File, ACS, Copyright 1999, 1 page, 1999.

*Primary Examiner*—Cynthia Hamilton
*Attorney, Agent, or Firm*—Frishauf, Holtz, Goodman, Langer & Chick, P.C.

[57] ABSTRACT

Disclosed is an image forming material comprising a metal support having an anodization layer on its surface, and provided on the anodization layer, a light sensitive layer containing a first compound capable of generating an acid on exposure of an actinic light, a second compound having a group cross-linking by an acid or a third compound having a chemical bond capable of being decomposed by an acid, and an infrared absorber, wherein the thickness of the anodization layer is 10 to 60 mg/dm$^2$.

16 Claims, No Drawings

IMAGE FORMING MATERIAL AND IMAGE FORMING METHOD

FIELD OF THE INVENTION

The present invention relates to a positive or negative working image forming material capable of being employed as a off-set master for off-set printing and particularly to an image forming material employed as a presensitized planographic printing plate for direct plate making capable of directly writing digital data in computer therein employing a semi-conductor laser light of the near infrared to infrared wavelength regions. Further, the present invention relates to a method for forming an image in the above image forming material.

BACKGROUND OF THE INVENTION

As an image forming material comprising a positive working light sensitive layer to be solubilized by actinic light irradiation, an image forming material comprising a light sensitive layer containing an acid generating compound and an acid decomposable compound is known. That is, a light sensitive composition containing an acid generating compound and a water insoluble compound having a specific group capable of decomposed by an acid is disclosed in U.S. Pat. No. 3,779,779, a light sensitive composition containing an acid generating compound and a compound having an acetal or a ketal in the main chain is disclosed in Japanese Patent O.P.I. Publication No. 53-133429/1978, and a light sensitive composition containing an acid generating compound and a compound having a silylether group is disclosed in Japanese Patent O.P.I. Publication No. 65-37549/1985. These compositions have sensitivity in the ultraviolet range, which are capable of being alkali solubilized by imagewise ultraviolet ray exposure to provide non-image portions at exposed portions and to provide image portions at non-exposed portions. The imagewise ultraviolet ray exposure is generally carried out through a mask film by employing ultraviolet rays emitted from a light source such as a halogen lamp or a high pressure mercury lamp, or can be carried out by employing a short wavelength laser such as an argon laser or a helium-cadmium laser. However, these light sources are expensive, and troublesome in using due to its large size. Further, the above described light sensitive materials could not necessarily provide a satisfactory result in view of sensitivity.

In order to increase sensitivity of light sensitive materials, the present inventor proposed a positive working light sensitive material comprising a mixture of solvents different in viscosity in Japanese Patent O.P.I. Publication No. 8-320556, and a positive working light sensitive material comprising a light sensitive compound, its good solvent and its poor solvent in Japanese Patent O.P.I. Publication No. 8-328245. However, the imagewise exposure employing ultraviolet rays still has the problems as described above. A simple and less expensive exposure method has been eagerly sought.

A technique for forming an image by irradiation of infrared rays of a cheap and compact semiconductor laser is proposed. In U.S. Pat. No. 5,340,699 is disclosed an image forming material comprising a light sensitive layer containing an acid generating compound, a resol resin, a novolak resin and an infrared absorber, wherein a negative image is formed by a method comprising imagewise exposing the material to infrared rays, heating the exposed material before development, and then developing the heated material, or a positive image is formed by a method comprising imagewise exposing the material to infrared rays, and then developing the exposed material without heating. In Japanese Patent O.P.I. Publication No. 53-133429 is disclosed an image forming material comprising a light sensitive layer containing an acid generating compound, an acid decomposable compound and a blue dye (crystal violet). However, these techniques can not provide a good image, since laser light is irregularly reflected on the support surface, resulting in dot area fluctuation and poor image reproduction. Particularly when a presensitized planographic printing plate employing an aluminum plate as a support is exposed to a semi-conductor laser light to form an image, the laser light is reflected on the support surface to diffuse a heat energy, which causes dot gain and sensitivity lowering, resulting in serious problems in image forming.

SUMMARY OF THE INVENTION

The present invention has been made in view of the above.

An object of the invention is to provide a positive or negative working image forming material for direct plate making capable of being exposed to light of near infrared to infrared regions to form an image, and particularly to provide a positive or negative working image forming material for direct plate making capable of directly writing digital data in computer therein employing laser light of the near infrared to infrared regions, which provides high sensitivity to light of the near infrared to infrared regions, and a high quality image with reduced dot area fluctuation.

Another object of the invention is to provide an image forming method employing the image forming material and such a laser light.

DETAILED DESCRIPTION OF THE INVENTION

The above object of the invention can be attained by the followings:

1. An image forming material comprising a metal support, and provided thereon, a light sensitive layer containing a compound capable of generating an acid on exposure of an actinic light, a compound having a group cross-linking by an acid, and an infrared absorber, wherein the metal support has an anodization layer with a thickness of 10 to 60 mg/dm² on its surface, 2. An image forming material comprising a metal support, and provided thereon, a light sensitive layer containing a compound capable of generating an acid on exposure of an actinic light, a compound having a chemical bond capable of being decomposed by an acid, and an infrared absorber, wherein the metal support has an anodization layer with a thickness of 10 to 60 mg/dm² on its surface, 3. An image forming material comprising a metal support, and provided thereon, a heat insulating layer, and a light sensitive layer containing a compound capable of generating an acid on exposure of an actinic light, a compound having a group cross-linking by an acid, and an infrared absorber, wherein the thickness of the heat insulating layer is 0.001 to 10 mg/m², 4. An image forming material comprising a metal support, and provided thereon, a heat insulating layer, and a light sensitive layer containing a compound capable of generating an acid on exposure of an actinic light, a compound having a chemical bond capable of being decomposed by an acid, and an infrared absorber, wherein the thickness of the heat insulating layer is 0.001 to 10 mg/m², 5. An image forming method comprising the step of imagewise exposing to an actinic light the light sensitive layer of the above described image forming material, 6. An image forming material comprising a metal support having an anodization layer on its surface, and provided on the anodization layer, a light sensitive layer containing a first compound capable of generating an acid on exposure of an actinic light, a second compound having a group cross-linking by an acid or a third compound having a chemical bond capable of being decomposed by an acid, and an infrared absorber, wherein the thickness of the anodization layer is 10 to 60 mg/dm², 7. The image forming material of item 6, wherein the thickness of the anodization layer is 20 to 50 mg/dm², 8. The image forming material of item 6, wherein a heat insulating layer is provided between the light sensitive layer and the anodization layer, the heat insulating layer containing a water soluble polymer or a water soluble low molecular weight compound, wherein the thickness of the heat insulating layer is 0.001 to 10 mg/m², 9. The image forming material of item 6, wherein the anodization layer of the metal support has a center line average surface roughness ($R_a$) of 0.3 to 0.7 μm, and has an average surface roughness ($R_z$) of 3.0 to 6.0 μm, 10. The image forming material of item 6, wherein the surface energy, γ(H) of the anodization layer of the support is 15 to 50 dyn/cm, γ(H) being represented by the following equation:

γ(H)dyn/cm

=[{1.159+2.159×cos(contact angle of H₂O)—cos(contact angle of CH₂I₂)}/0.379]² wherein the contact angle of H₂O is a value obtained by being measured at 25° C. after 1.7 μl of H₂O are dripped on the surface, and the contact angle of CH₂I₂ is a value obtained by being measured at 25° C. after 1.3 μl of CH₂I₂ are dripped on the surface, 11. The image forming material of claim 6, wherein the water retention amount on the anodization layer of the support is 2.0 to 6.0 ml/m², 12. The image forming material of item 6, wherein the first compound is an organic halogen containing compound, or an onium salt selected from the group consisting of a salt of diazonium, sulfonium, or iodonium ion with $BF_4^-$, $PF_6^-$, $SbF_6^-$, $SiF_6^{2-}$, or $ClO_4^-$, the second compound is selected from the group consisting of a compound having a methylol group or a methylol derivative group, a melamine resin, a furan resin, an isocyanate, and a blocked isocyanate, the third compound is selected from the group consisting of an orthocarbonic acid ester, acetal, ketal and silylether, and the infrared absorber is a cyanine dye represented by the following formula (3) or (4):

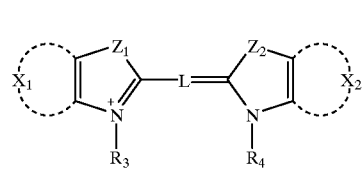

formula (3)

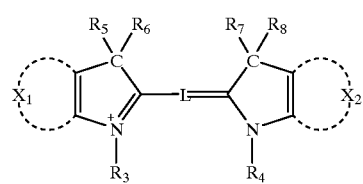

formula (4)

wherein $Z_1$ and $Z_2$ independently represent a sulfur atom, a selenium atom or an oxygen atom; $X_1$ and $X_2$ independently represent a non-metallic atomic group necessary to form a benzene or naphthalene ring, which may have a substituent; $R_3$ and $R_4$ independently represent a substituent, provided that one of $R_3$ and $R_4$ represents an anionic group, $R_5$, $R_6$, $R_7$ and $R_8$ independently represent a hydrogen atom, a halogen atom or an alkyl group having 1 to 3 carbon atoms; and L represents a linkage with a conjugated bond having 5 to 13 carbon atoms, 13. The image forming material of item 12, wherein the orthocarbonic acid ester, acetal, ketal or silylether further has —(CH₂CH₂O)ₙ— in its chemical structure in which n is an integer of 1 to 5, 14. The image forming material of item 6, wherein, in the light sensitive layer, the content of the first compound is 0.1 to 20 weight %, the content of the second compound is 1 to 80 weight %, the content of the third compound is 5 to 70 weight %, and the content of the infrared absorber is 0.5 to 10 weight %, or 15. The image forming material of item 6, wherein the metal support is an aluminum plate.

The preferable embodiment includes the above described image forming material wherein the heat insulating layer is provided between the support and the light sensitive layer, the above described image forming material wherein the heat insulating layer contains a resin which is soluble in a developer, the above described image forming material wherein the metal support has a center line average surface roughness ($R_a$) of 0.3 to 0.7 μm, and has an average surface roughness ($R_z$) of 3.0 to 6.0 μm, and the surface energy, γ(H: hydrogen bond force) of the support after removing the light sensitive layer is 15 to 50 dyn/cm, γ(H) being represented by the following equation:

γ(H)dyn/cm

=[{1.159+2.159×cos(contact angle of H₂O)—cos(contact angle of CH₂I₂)}/0.379]² wherein the contact angle of H₂O is a value obtained by being measured after 1.7 μl of H₂O are dripped on the surface, and the contact angle of CH₂I₂ is a value obtained by being measured after 1.3 μl of CH₂I₂ are dripped on the surface, and the above described image forming material wherein the metal support is an aluminum plate.

The present inventor has made an extensive study on a heat mode writing type image forming material for direct printing plate-making being capable of directly writing digital data in a computer therein employing a semiconductor laser light of the near infrared to infrared wavelength regions, which provides high sensitivity to light of the near infrared to infrared regions, and a high quality image with reduced dot area fluctuation. As a result, the present inventor has found that heat insulating on a metal support surface gives laser light exposure with high efficiency, and completed the invention. The present invention has been attained by providing a heat insulating layer with a specific thickness or an anodization layer with a specific thickness on the support surface, and the object of the invention has been attained thereby.

The present invention will be detailed below.

The image forming material and the image forming method employing the same of the invention will be explained in that order below.

(1) Image Forming Material

The image forming material of the invention is divided into two embodiments. Embodiment 1 is an image forming material (positive working type) comprising a metal support, and provided thereon, a light sensitive layer containing a compound capable of generating an acid on exposure of an actinic light, a compound having a chemical bond capable of being decomposed by an acid, and an infrared absorber, wherein the metal support has an anodization layer with a thickness of 10 to 60 mg/m$^2$ on its surface, or an image forming material (negative working type) comprising a metal support, and provided thereon, a light sensitive layer containing a compound capable of generating an acid on exposure of an actinic light, a compound having a group cross-linking by an acid, and an infrared absorber, wherein the metal support has an anodization layer with a thickness of 10 to 60 mg/m$^2$ on its surface.

Embodiment 2 is an image forming material (positive working type) comprising a metal support, and provided thereon, a heat insulating layer, and a light sensitive layer containing a compound capable of generating an acid on exposure of an actinic light, a compound having a chemical bond capable of being decomposed by an acid, and an infrared absorber, wherein the thickness of the heat insulating layer is 0.001 to 10 mg/m$^2$, or an image forming material (negative working type) comprising a metal support, and provided thereon, a heat insulating layer, and a light sensitive layer containing a compound capable of generating an acid on exposure of an actinic light, a compound having a group cross-linking by an acid, and an infrared absorber, wherein the thickness of the heat insulating layer is 0.001 to 10 mg/m$^2$.

The support in the invention has specific surface characteristics to obtain high sensitivity and to minimize dot area fluctuation. The support in the invention will be explained below.

(Support, Insulating Layer and Anodization Layer)

The metal support used in the invention includes a metal plate such as aluminum, zinc, steel or copper, and a metal plate which is plated or vacuum evaporated with chromium, zinc, copper, nickel, aluminum or iron. The support is preferably an aluminum support including a support made of pure aluminum and that made of aluminum alloy. As an aluminum alloy, there can be used various ones including an alloy of aluminum and each of metals such as silicon, copper, manganese, magnesium, chromium, zinc, lead, bismuth, and nickel.

The support used in the invention is preferably an aluminum plate which is surface roughened.

It is preferable that the aluminum support is subjected to degreasing treatment for removing rolling oil prior to surface-roughening. The degreasing treatment to be used includes degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and oxidized films which can not be removed by the above-mentioned degreasing treatment alone.

The support is subjected to graining (surface roughening) treatment including a mechanically graining method and an electrolytically etching method in order to improve its adhesion to a light sensitive layer and water retention property.

The mechanically graining method includes a ball graining m ethod, a brush graining method, a liquid horning graining method and a buff graining method. The above methods can be used singly or in combin ation according to an aluminum material composition. The electrolytically etching method is a method electrolytically etching the support in an electrolyte solution containing hydrochloric acid or nitric acid with alternating or direct electric current. The support is grained according to one or both of these methods. The electrolyte solution includes a solution of hydrochloric acid, nitric acid or a mixture thereof, to which a salt such as aluminum nitrate, aluminum chloride, ammonium nitrate, ammonium chloride, manganese nitrate, manganese chloride, iron nitrate, or iron chloride may be added, and a neutral salt solution of sodium chloride or sodium nitrate. The electrolyte solution containing mainly nitric acid contains nitric acid in an amount of 2 to 40 g/liter, to which an aluminum nitrate salt may be added. Inorganic acids, carboxylic acids, amines, ketones, aldehydes or compounds having a mixture structure thereof may be added to the electrolyte solution. In the invention, the aluminum surface is mechanically grained to form a roughly grained surface, and then chemically treated, followed by electrolytically etching to form a fine grained surface, whereby a support having a large average surface roughness (Rz) and uniformly grained surface is obtained, and an aluminum ion produced during electrolytically etching and electric power used are minimized. In the mechanically graining method, abrasives used or aluminum dust produced during graining remain on the surface of the aluminum support, and when the grained aluminum support is followed by electrolytically etching, the surface is non-uniform, and insoluble residues produce on the aluminum support surface. Therefore, before electrolytically etching, the aluminum surface is necessary to be subjected to chemical treatment employing an aqueous acid or alkali solution in order to obtain a smooth and uniform surface. The acid to be used in this case includes, for example, a sulfuric acid, a persulfuric acid, a hydrofluoric acid, a phosphoric acid, a nitric acid and a hydrochloric acid and an alkali to be used includes, for example, sodium hydroxide, sodium silicate and sodium carbonate. These acids or alkalis can be used singly or in combination. Chemical treatment is ordinarily carried out at 40 to 100° C. for 5 to 300 seconds employing an aqueous 0.05 to 40 weight % acid or alkali solution. The surface of thus obtained support has smuts, and the surface of the support is preferably subjected to desmut treatment such as water washing or alkali etching. Such a treatment includes an alkali etching treatment disclosed in Japanese Patent Publication No. 48-28123 or a desmut treatment disclosed in Japanese Patent O.P.I. Publication No. 53-12739.

Voltage applied during electrolytically etching is preferably 1 to 50 volts, and more preferably 2 to 30 volts. Electric density is preferably 10 to 150 A/dm$^2$, and more preferably 20 to 100 A/dm$^2$. Quantity of electricity is 100 to 20,000 C/dm$^2$, preferably 100 to 10,000 C/dm$^2$, and more preferably 200 to 5,000 C/dm$^2$. The temperature is preferably 10 to 50° C., and more preferably 15 to 45° C. The concentration of hydrochloric acid or nitric acid in the electrolyte solution used is preferably 0.01 to 5 weight %.

(Anodization layer of embodiment 1)

In the invention, the metal support surface is anodized. Anodization was ordinarily carried out after surface roughening. The electrolyte used, for example, in the anodization of an aluminum plate may be any, provided that it provides a porous anodization layer.

Generally, anodization is carried out using a solution containing one or more of sulfuric acid, chromic acid, oxalic acid, phosphoric acid and malonic acid. The electrolyte concentration of the solution is properly determined according to kinds of electrolytes used. The anodization conditions vary according to kinds of electrolytes used, and can not specifically be limited, but generally, the electrolyte concentration of the solution is 1 to 80 weight %, the solution temperature is 1 to 70° C., current density is 1 to 60 A/dm$^2$, applied voltage is 1 to 100 V, the electrolytic time is 10 seconds to 5 minutes. A sulfuric acid anodization method, which is especially preferable, is ordinarily carried out employing direct electric current, but may be carried out employing alternating electric current. In the sulfuric acid anodization method, anodization is carried out in a 5 to 30% sulfuric acid electrolyte solution at 20 to 60° C. for 5 to 250 seconds. The electrolyte solution preferably contains an aluminum ion.

In this method, current density is preferably 1 to 20 A/dm$^2$. In U.S. Pat. No. 1,412,768 is disclosed a method in which electrolytically etching is carried out at high current density in a sulfuric acid solution, or in U.S. Pat. No. 3,511,661 is disclosed a method in which electrolytically etching is carried out in a phosphoric acid solution. In the invention, the thickness of the anodization layer formed is 10 to 60 mg/dm$^2$, preferably 20 to 60 mg/dm$^2$, and more preferably 20 to 50 mg/dm$^2$. The thickness of less than 10 mg/dm$^2$ results in writing efficiency due to laser light and can not obtain the advantages of the invention. To the contrary, the thickness exceeding 60 mg/dm$^2$ provides a high heat insulating effect but is likely to produce stains at non-image portions, resulting in poor image quality. The thickness of the anodization layer is, for example, obtained by immersing the anodized aluminum plate in a solution containing phosphoric acid and chromic acid (prepared by dissolving 35 ml of an aqueous 85% phosphoric acid solution and 20 g of chromium (IV) oxide in 1 liter of water) to dissolve the anodization layer and measuring the aluminum weight before and after the immersing.

After anodization, sealing is carried out by treating the aluminum support with a boiling water, steam, a sodium silicate solution or a dichromic acid solution. Further, the aluminum support can be surface treated with an aqueous water soluble polymer solution or an aqueous solution of a metal zirconium fluoride salt.

The preferable treatment comprises immersing the support in 80 to 95° C. water or in an aqueous alkaline solution. After that, the support is subjected to sealing treatment employing an aqueous nitrite solution, whereby the anodization layer is sealed. The examples of nitrite include salts of nitrous acid with elements of Ia, IIa, IIb, IIIb, IVa, IVb, VIa, VIIa and VIII of the Periodic Table, or a salt of nitrous acid with ammonia (ammonium nitrite). The salts of nitrous acid with metals are preferably LiNO$_2$, NaNO$_2$, KNO$_2$, Mg(NO$_2$)$_2$, Ca(NO$_2$)$_2$, Zn(NO$_2$)$_2$, Al(NO$_2$)$_3$, Zr(NO$_2$)$_4$, Sn(NO$_2$)$_3$, Cr(NO$_2$)$_3$, Co(NO$_2$)$_2$, Mn(NO$_2$)$_2$, or Ni(NO$_2$)$_2$, and more preferably a salt of nitrous acid with an alkali metal. The nitrite treatment is carried out by immersing the support in an aqueous nitrite solution or by coating the aqueous nitrite solution on the support, and preferably carried out by the former. The treatment conditions are different due to kinds of supports or nitrites used, and are not specifically limited. When an aqueous sodium nitrite solution is employed, the sodium nitrite concentration is ordinarily 0.001 to 10 weight %, preferably 0.01 to 2 weight %, the solution temperature is ordinarily room temperature to 100° C., preferably 10 to 180 seconds. The pH of the solution is preferably 8.0 to 11.0, and more preferably 8.5 to 9.5. In order to adjust the pH to the above range, there is a method employing, for example, an alkali buffer solution. The alkali buffer solution is not specifically limited, but the solution includes a solution of a mixture of sodium hydrogen carbonate and sodium hydroxide, a solution of a mixture of sodium carbonate and sodium hydroxide, a solution of a mixture of sodium carbonate and sodium hydrogen carbonate, a solution of a mixture of sodium chloride and sodium hydroxide, a solution of a mixture of hydrochloric acid and sodium carbonate and a solution of a mixture of sodium borontetrafluoride and sodium hydroxide. In the above alkali buffer solution, an alkali metal salt other than the sodium salt, for example, a potassium salt can be used. In order to enhance the nitrite treatment effects, ultrasonic wave can be applied to the nitrite solution during the treatment. The various additives, for example, a surface active agent, can be optionally added to the nitrite solution.

(Heat insulation layer of embodiment 2)

In embodiment 2 in the invention the heat insulating layer on the metal support will be explained below. The insulating layer can be provided on the metal support or on the anodization layer on the metal support surface.

The heat insulating layer preferably contains a water soluble (hydrophilic) resin (polymer) or a water soluble low molecular weight compound, and more preferably contains a polymer soluble in a developer as described later. An aqueous solution of the water soluble polymer or water soluble low molecular weight compound is coated on the support to form a heat insulating layer. The examples of the polymer includes polyacrylamide, polyacrylic acid, polyvinyl alcohol, polyhydroxyethylacrylate, polyvinyl pyrrolidone, polyethyleneimine, polyvinyl imidazoline, polyalkylaminoethyl acrylate, polyethylene glycol, polypropylene glycol, a polyurethane resin, polyhydroxymethylurea, a polyhydroxymethylmelamine resin, and a water soluble polymer such as soluble starch, CMC (carboxymethyl cellulose), hydroxyethyl cellulose, guar gum, tragacanth gum, xanthene gum, sodium alginate, gelatin, and high polymer compounds including a monomer unit having a sulfo group described in Japanese Patent O.P.I. Publication No. 59-101651.

Polyacrylic acid or CMC is especially preferable.

It is preferable that the above described polymer is dissolved in water, and the resulting coating solution is coated on the metal support to form a heat insulating layer. The water soluble polymer content of the coating solution is preferably not more than 10 weight %, and more preferably 0.001 to 1 weight %. The pH of the solution is preferably not more than 9, and more preferably 4 to 9, at 30° C. or more, preferably 50 to 95° C.

The water soluble low molecular weight compound used in the insulating layer in the invention includes an amino acid or its salt described in Japanese Patent O.P.I. Publication Nos. 60-149491 and 63-165183, amines having a hydroxy group or their salts described in Japanese Patent O.P.I. Publication No. 60-232998, phosphate described in Japanese Patent O.P.I. Publication No. 62-19494 and a compound having an amino group and one of a carboxylic acid group, a sulfonic acid group, a phosphinic acid group, and a phosphonic acid group, or its salt. The examples of the low molecular weight compound include an amino acid such as glycine, alanine, valine, serine, threonine, aspartic acid, glutamic acid, arginine, lysine, tryptophane, p-hydroxyphenylglycine, dihydroxyethylglycine, or anthranilic acid, a phosphonic acid such as 1-aminomethylphosphonic acid, 2-aminomethylphosphonic acid, 2-aminopropylphosphonic acid, 4-aminophenylphosphonic acid, 1-aminoethane-1,1-diphosphonic acid, 1-amino-1-phenylmethane-1,1-diphosphonic acid, 1-dimethylaminobutane-1,1-diphosphonic acid, 1-aminoethane-1,1-diphosphonic acid, ethylenediaminetetramethylenephosphonic acid, a phosphinic acid compound in which the phosphonic acid group of the above phosphonic acid is substituted by a phosphonic group and their salts with phosphoric acid, hydrochloric acid, sulfuric acid, a sulfonic acid (for example, methanesulfonic acid), formic acid, an alkali metal, ammonia, a lower alkanol amine (for example, triethanolamine) or a lower alkyl amine (for example, triethylamine).

The thickness of the heat insulating layer is 0.001 to 10 mg/m², and preferable 0.05 to 10 mg/m².

It is preferable in the invention that the metal support or anodization layer has a center line average surface roughness ($R_a$) of 0.3 to 0.7 μm, and has an average surface roughness ($R_z$) of 3.0 to 6.0 μm.

In the invention, the $R_a$ and $R_z$ of the metal support surface or anodization layer surface are obtained by being measured with a non-contact type three dimensional minute surface roughness tester, RST PLUS produced by WYKO Co., Ltd. The measuring conditions are as follows:

Mode: Vertical scanning method

Object glass: ×40

Magnification: 1.0

Area to be measured: 160 μm×120 μm

Data numbers: 368×236

(Space sampling interval: 0.42 μm×0.48 μm)

When discontinuous data are obtained in the above measurement of $R_a$, the data are corrected by a soft ware attached to the tester to be continuous, and $R_a$ according to JIS Standard is three-dimensionally enlarged to obtain a center line average surface roughness, $R_a$ (nm). In the average surface roughness, $R_z$ (nm), the same correction as $R_a$ (nm) is carried out.

It is preferable in the invention that the surface energy, γ(H: hydrogen bond force) of the support or the anodization layer is 15 to 50 dyn/cm, γ(H) being represented by the following equation:

$$\gamma(H) \text{dyn/cm} = [\{1.159 + 2.159 \times \cos(\text{contact angle of } H_2O) - \cos(\text{contact angle of } CH_2I_2)\}/0.379]^2$$

wherein the contact angle of $H_2O$ is a value obtained by being measured at 25° C. after 1.7 μl of $H_2O$ are dripped onto the surface, and the contact angle of $CH_2I_2$ is a value obtained by being measured at 25° C. after 1.3 μl of $CH_2I_2$ are dripped onto the surface.

The metal support (particularly an aluminum plate) used in the invention has non-image portions which attracts water and repels oleophilic ink, and is required to have a surface with excellent hydrophilicity and excellent water retention, and further a surface with good adhesion to a light sensitive layer, that is, to have conflicting surface properties. High water retention of the surface provides excellent printing properties such as excellent gradation reproduction and reduced stain occurrence at non-image portions. Physical measurement as to water retention has so far been carried out wherein water is dripped on non-image portions of the surface, followed by drying. However, this measurement fluctuates too greatly to secure its accuracy. In Japanese Patent O.P.I. Publication No. 6-247070 is disclosed a method in which water on the surface is squeegeed with silicone rubber rollers to remove water from the surface. This provides fluctuated values due to squeegeeing speed, roller type, or surface properties of portions to be measured, resulting in a lowering of reproducibility. The present inventor has made a study on a method of measuring water retention amount on a support surface with good accuracy, and found that the method comprises the steps of immersing a metal support in water, and then drawing up the support perpendicular to the surface of the water at a rate of 2 cm/minute. Further, after the image forming material of the invention was developed to obtain non-image portions on the surface, the water retention amount on the non-image portions was measured according to the method and the surface energy γ(H) on non-image portions was measured, and the resulting values were compared with the printing properties. As a result, the non-image portion surface with a water retention amount of 2.0 to 6.0 ml/m², preferably 3.0 to 5.0 ml/m², and with a surface energy γ(H) of 15 to 50 dyn/cm, provides good tone reproduction, particularly excellent dot reproduction. As described above, it is preferable in the present invention to control a water retention amount on the non-image portions on the metal support, particularly a surface energy γ(H) on non-image portions, whereby the advantageous effects are obtained that tone reproduction is improved, particularly in dot gain being reduced.

In the invention, the above described $R_a$, $R_z$, surface energy or water retention amount of the support surface may be those of the support before coating a light sensitive layer or those of the support after removing the light sensitive layer coated on the support, but preferably is those of the support after removing the light sensitive layer. An aqueous alkaline solution is used to remove the light sensitive layer coated on the support. The aqueous alkaline solution is obtained as follows:

One hundred and twenty weight parts of an aqueous 48.5 weight % potassium hydroxide solution, twenty seven weight parts of A potassium silicate produced by Nihon Kagaku Co. Ltd. (containing 26 weight % of $SiO_2$ and 13.5 weight % of $K_2O$, and one hundred weight parts of pure water were mixed, and the mixture solution was diluted 6 times by volume with water to obtain an aqueous alkaline solution for removing a light sensitive layer.

(Light sensitive layer)

(A compound capable of generating an acid on irradiation of an active light)

The compound (hereinafter referred to as the acid generating compound in the invention) capable of generating an acid on irradiation of an active light used in the light sensitive composition of the invention includes various conventional compounds and mixtures. For example, a salt of diazonium, phosphonium, sulfonium or iodonium ion with $BF_4^-$, $PF_6^-$, $SbF_6^-$ $SiF_6^{2-}$ or $ClO_4^-$, an organic halogen containing compound, o-quinonediazide sulfonylchloride or a mixture of an organic metal and an organic halogen containing compound is a compound capable of generating or releasing an acid on irradiation of an active light, and can be used as the acid generating compound in the invention. The organic halogen containing compound known as an photoinitiator capable of forming a free radical forms a hydrogen halide and can be used as the acid generating compound of the invention.

The examples of the organic halogen containing compound capable of forming a hydrogen halide include those disclosed in U.S. Pat. Nos. 3,515,552, 3,536,489 and 3,779,778 and West German Patent No. 2,243,621, and compounds generating an acid by photodegradation disclosed in West German Patent No. 2,610,842. The examples of the acid generating compounds used in the invention include o-naphthoquinone diazide- 4-sulfonylhalogenides disclosed in Japanese Patent O.P.I. Publication No. 50-30209.

The preferable acid generating compound in the invention is an organic halogen containing compound in view of sensitivity to infrared rays and storage stability of an image forming material using it. The organic halogen containing compound is preferably a halogenated alkyl-containing triazines or a halogenated alkyl-containing oxadiazoles. Of these, halogenated alkyl-containing s-triazines are especially preferable. The examples of the halogenated alkyl-containing oxadiazoles include a 2-halomethyl-1,3,4-oxadiazole compound disclosed in Japanese Patent O.P.I. Publication Nos. 54-74728, 55-24113, 55-77742/1980, 60-3626 and 60-138539. The preferable examples of the 2-halomethyl-1,3,4-oxadiazole compound are listed below.

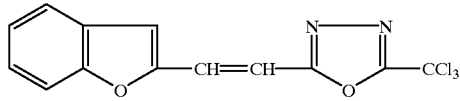

A

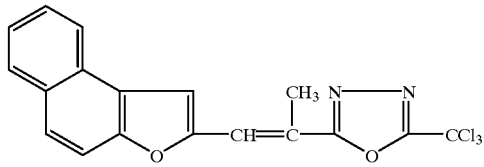

B

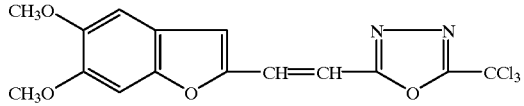

C

The halogenated alkyl containing triazines are preferably a compound represented by the following formula (1):

formula (1)

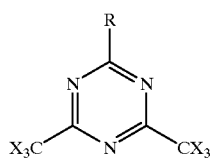

wherein R represents an alkyl group, a halogenated alkyl, an alkoxy group, a substituted or unsubstituted styryl group or a substituted or unsubstituted aryl group (for example, phenyl or naphthyl group); and $X_3$ represents a halogen atom.

The examples of an s-triazine acid generating compound represented by formula (1) are listed below.

(1)

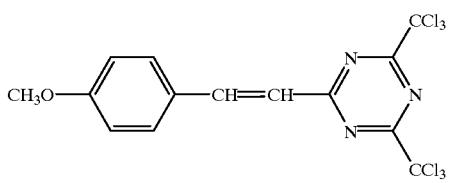

(2)

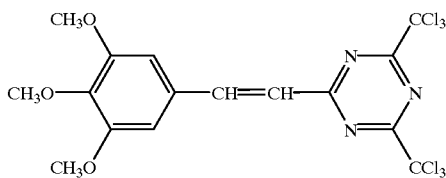

(3)

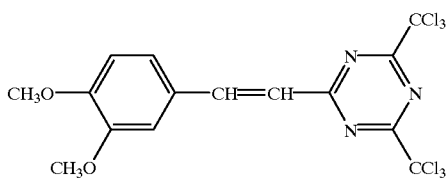

(4)

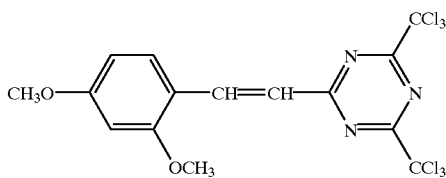

(5)

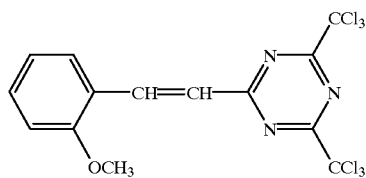

(6)

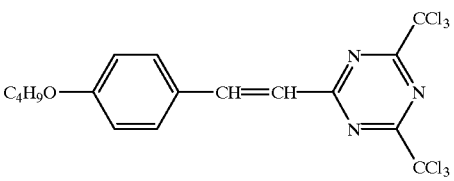

(7)

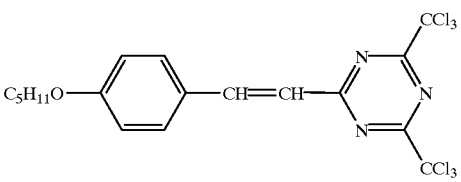

(8)

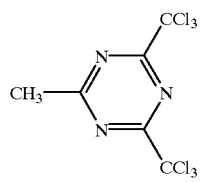

-continued

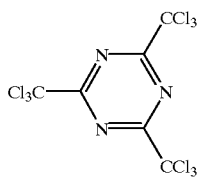
(9)

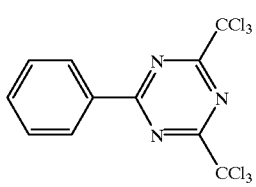
(10)

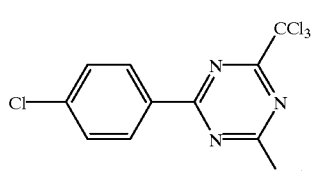
(11)

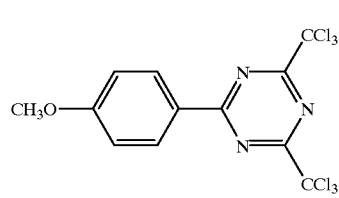
(12)

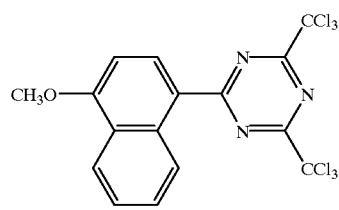
(13)

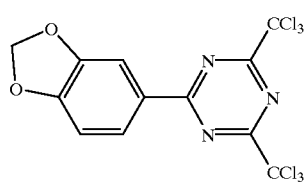
(14)

The content of the acid generating compound in the light sensitive layer is preferably 0.1 to 20% by weight, and more preferably 0.2 to 10% by weight based on the total weight of the solid components of the light sensitive layer, although the content broadly varies depending on its chemical properties, the kinds of light sensitive layer or physical properties of the components used in the light sensitive layer.

(Compound having a chemical bond capable of being decomposed by an acid)

The compound (hereinafter referred to also as the acid decomposable compound in the invention) having a chemical bond capable of being decomposed by an acid used in the invention includes a compound having a C—O—C bond disclosed in Japanese Patent O.P.I. Publication Nos. 48-89003/1973, 51-120714/1976, 53-133429/1978, 55-12995/1980, 55-126236/1980 and 56-17345/1981, a compound having an Si—O—C bond disclosed in Japanese Patent O.P.I. Publication Nos. 60-37549/1985 and 60-121446/1985, another acid decomposable compound disclosed in Japanese Patent O.P.I. Publication Nos. 60-3625/1985 and 60-10247/1985, a compound having an Si—N bond disclosed in Japanese Patent O.P.I. Publication No. 62-222246/1987, a carbonic acid ester disclosed in Japanese Patent O.P.I. Publication No. 62-251743/1987, an orthocarbonic acid ester disclosed in Japanese Patent O.P.I. Publication No. 62-2094561/1987, an orthotitanic acid ester disclosed in Japanese Patent O.P.I. Publication No. 62-280841/1987, an orthosilicic acid ester disclosed in Japanese Patent O.P.I. Publication No. 62-280842/1987, an acetal or ketal disclosed in Japanese Patent O.P.I. Publication No. 63-10153/1988 and a compound having a C—S bond disclosed in Japanese Patent O.P.I. Publication No. 62-244038/1987.

Of these compounds, the compound having a C—O—C bond, the compound having an Si—O—C bond, the orthocarbonic acid esters, the acetals or ketals or the silylethers disclosed in Japanese Patent O.P.I. Publication Nos. 53-133429/1978, 56-17345/1981, 60-121446/1985, 60-37549/1985, 62-209451/1987 and 63-10153/1988 are preferable. Of these compounds is especially preferable a polymer disclosed in Japanese Patent O.P.I. Publication No. 53-133429/1978 which has a repeated acetal or ketal group in the main chain and increasing solubility in a developer by action of an acid or a compound capable of being decomposed by an acid disclosed in Japanese Patent O.P.I. Publication No. 63-10153/1988, which has the following structure:

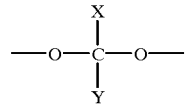

Wherein X represents a hydrogen atom or

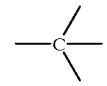

Y represents

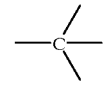

provided that X and Y may be the same or different.

The examples of the acid decomposable compound used in the invention include compounds disclosed in the above described patent specifications and their synthetic method is described in the above described patent specifications.

As the acid decomposable compound in the invention are preferable orthocarbonic esters, acetals, ketals or silyl ethers, each compound having a —(CH$_2$CH$_2$O)$_n$— group in which n is an integer of 1 to 5, in view of sensitivity and developability. Of the compound having a —(CH$_2$CH$_2$O)$_n$— group, n is especially preferably 1 to 4. The typical example of such a compound includes a condensation product of dimethoxycyclohexane, benzaldehyde or their derivative with diethylene glycol, triethylene glycol, tetraethylene glycol or pentaethylene glycol.

In the invention, the compound represented by the following formula (2) is preferable as the acid decomposable compound in view of sensitivity and developability.

formula (2)

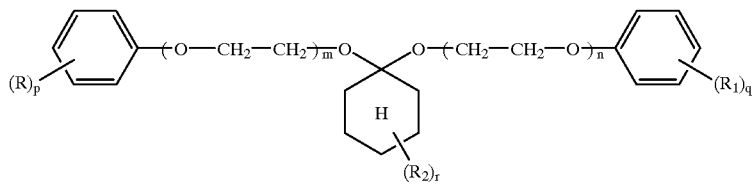

wherein R, $R_1$ and $R_2$ independently represent a hydrogen atom, an alkyl group having 1 to 5 carbon atoms, an alkoxy group having 1 to 5 carbon atoms, a sulfo group, a carboxyl group or a hydroxy group, p, q and r independently represent an integer of 1 to 3, and m and n independently represent an integer of 1 to 5. The alkyl group represented by R, $R_1$ and $R_2$ may be straight chained or branched, and includes a methyl group, an ethyl group, a propyl group, an isopropyl group, a butyl group, a tert-butyl group, and a pentyl group. The alkoxy group represented by R, $R_1$ and $R_2$ includes a methoxy group, an ethoxy group, a propoxy group, an isopropoxy group, a butoxy group, a tert-butoxy group, and a pentoxy group. In the compound represented by formula (2), m and n each especially preferably are 1 to 4. The compound represented by formula (2) can be prepared according to a conventional synthetic method.

The content of the acid decomposable compound in the invention is preferably 5 to 70% by weight, and more preferably 10 to 50% by weight based on the total solid weight of the light sensitive layer. The acid decomposable compounds in the invention can be used singly or in combination.

(Compound having a group cross-linking by an acid)

In the invention, the compound having a group cross-linking by an acid herein referred to is a compound (hereinafter referred to also as a cross-linking agent) cross-linking alkali soluble resins in the presence of an acid. The cross-linking agent cross-links the alkali soluble resin and lowers solubility in the alkali of the cross-linked alkali soluble resin. The alkali solubility lowering extent in the invention is such that the cross-linked alkali soluble resin is made insoluble in the alkali by being cross-linked. Concretely, when the light sensitive material is imagewise exposed which comprises a light sensitive layer containing the alkali soluble resin and the cross-linking agent on a support, the alkali soluble resin at exposed portions is cross-linked so that the cross-linked resin is insoluble in an alkali solution as a developer, in which the alkali soluble resin before exposure has been soluble in the developer, and the exposed material is developed with the developer to remain the exposed portions on the support. The cross-linking agent includes a compound having a methylol group or a methylol derivative group, a melamine resin, a furan resin, an isocyanate, and a blocked isocyanate (an isocyanate having a protective group). The cross-linking agent is preferably a compound having a methylol group or an acetoxymethyl group. The content of the cross-linking agent is preferably 1 to 80% by weight, and more preferably 5 to 60% by weight based on the total solid weight of light sensitive layer.

(Infrared absorber)

The infrared absorber used in the invention includes an infrared absorbing dye having an absorption in the wavelength range of 700 nm or more, carbon black and magnetic powder. The especially preferable infrared absorber has an absorption maximum in the wavelength range of 700 nm to 850 nm and having a molar extinction coefficient, $\epsilon$ of $10^5$ or more.

The above infrared absorber includes cyanine dyes, squarylium dyes, chloconium dyes, azulenium dyes, phthalocyanine dyes, naphthalocyanine dyes, polymethine dyes, naphthoquinone dyes, thiopyrilium dyes, dithiol metal complex dyes, anthraquinone dyes, indoaniline metal complex dyes and intermolecular charge transfer complex dyes. The above described infrared absorber includes compounds disclosed in Japanese Patent O.P.I. Publication Nos. 63-139191/1988, 64-33547/1989, 1-160683/1989, 1-280750/1989, 1-293342/1989, 2-2074/1990, 3-26593/1991, 3-30991/1991, 3-34891/1991, 3-36093/1991, 3-36094/1991, 3-36095/1991, 3-42281/1991 and 3-103476/1991.

In the invention, the infrared absorber is especially preferably a cyanine dye represented by the following formula (3) or (4):

formula (3)

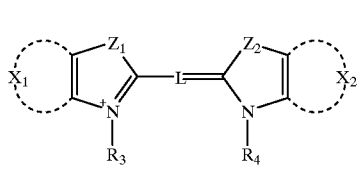

formula (4)

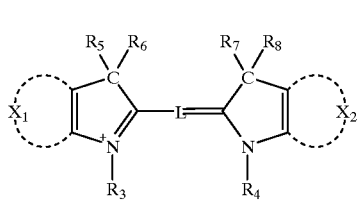

wherein $Z_1$ and $Z_2$ independently represent a sulfur atom, a selenium atom or an oxygen atom; $X_1$ and $X_2$ independently represent a non-metallic atomic group necessary to form a benzene or naphthalene ring, which may have a substituent; $R_3$ and $R_4$ independently represent a substituent, provided that one of $R_3$ and $R_4$ represents an anionic group, $R_5$, $R_6$, $R_7$ and $R_8$ independently represent a hydrogen atom, a halogen atom or an alkyl group having 1 to 3 carbon atoms; and L represents a linkage with a conjugated bond having 5 to 13 carbon atoms.

The cyanine dye represented by formula (3) or (4) includes a cyanine dye in which formula (3) or (4) itself forms a cation in its intramolecule and has an anionic group as a counter ion. The anionic group includes $Cl^-$, $Br^-$, $ClO_4^-$, $BF_4^-$, and an alkyl borate anion such as a t-butyltriphenyl borate anion.

The carbon number (n) in the linkage with a conjugated bond represented by L of formula (3) or (4) is preferably selected to match with wavelength of light emitted from an infrared laser used for exposure as a light source. For example, when a YAG laser, which emits 1060 nm light, is used, n is preferably 9 to 13. The conjugated bond may have a substituent, and may form a ring together with another atomic group. The substituent of the ring represented by $X_1$ or $X_2$ may be any, but is preferably a group selected from the group consisting of a halogen atom, an alkyl group having 1 to 5 carbon atoms, an alkoxy group having 1 to 5 carbon atoms, —$SO_3M$, and —COOM (in which M represents a hydrogen atom or an alkali metal atom). The substituent of $R_3$ and $R_4$ may be any, but is preferably an alkyl group having 1 to 5 carbon atoms, an alkoxy group having 1 to 5 carbon atoms, or —$((CH_2)_n$—O—$)_k$—$(CH_2)_m$OR (in which n and m independently represent an integer of 1 to 3, k represents 0 or 1, and R represents an alkyl group having 1 to 5 carbon atoms), or preferably one of $R_3$ and $R_4$ represents —$RSO_3M$, and the other —$RSO_3^-$, in which R represents an alkylene group having 1 to 5 carbon atoms, and M represents an alkali metal atom, or preferably one of $R_3$ and $R_4$ represents —RCOOM, and the other —RCOO$^-$, in which R represents an alkylene group having 1 to 5 carbon atoms, and M represents an alkali metal atom. It is more preferable in view of sensitivity or developability that one of $R_3$ and $R_4$ represents —$RSO_3M$ or —RCOOM as described above, and the other —$RSO_3^-$ or —RCOO$^-$ as described above.

When a semiconductor laser is used for exposure as a light source, a dye represented by formula (3) or (4) is preferably a dye having an absorption peak in the range of 750 to 900 nm and a molar extinction coefficient $\epsilon$ exceeding $1\times10^5$, and when a YAG laser is used for exposure as a light source, a dye represented by formula (3) or (4) is preferably a dye having an absorption peak in the range of 900 to 1200 nm and a molar extinction coefficient $\epsilon$ exceeding $1\times10^5$.

The examples of the infrared absorber preferably used in the invention are listed below, but are not limited thereto.

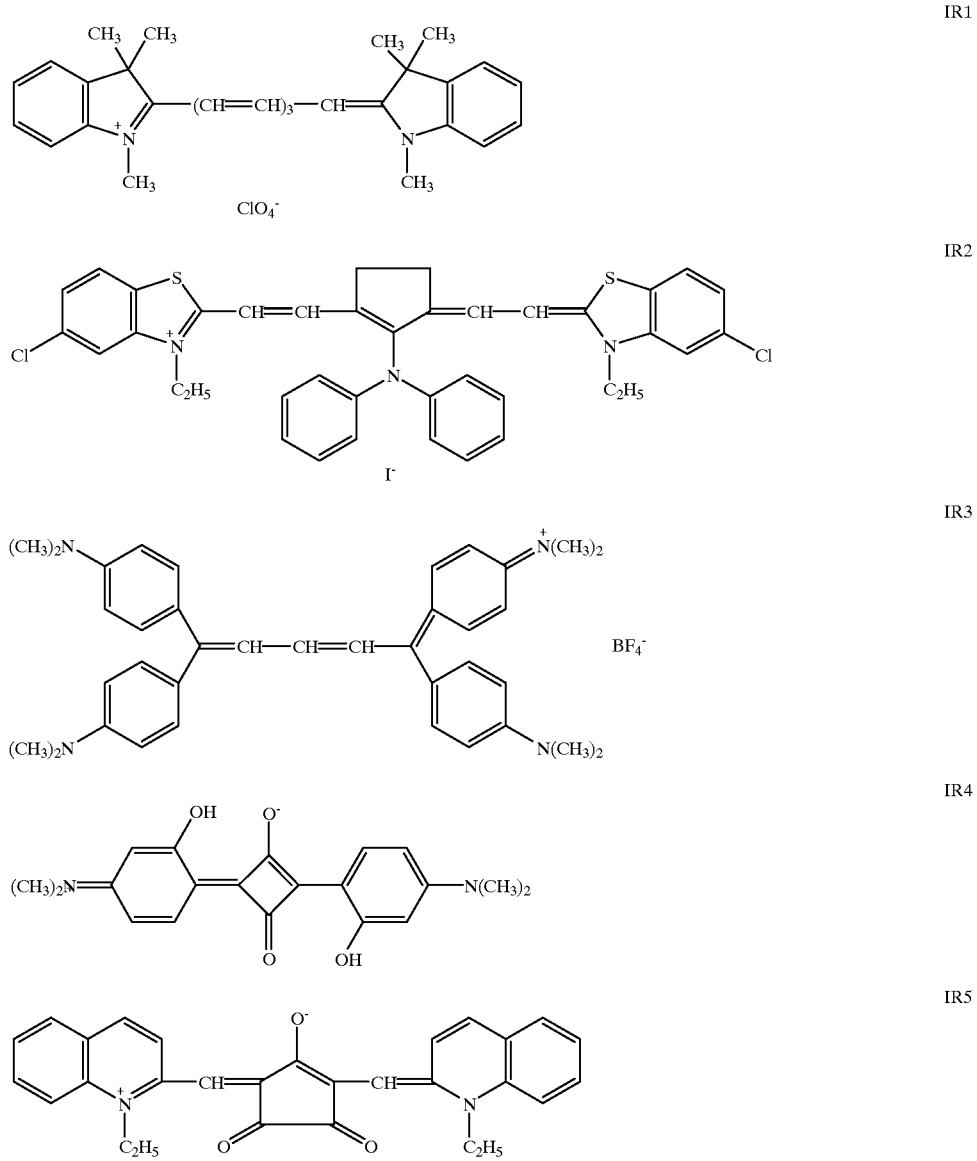

-continued
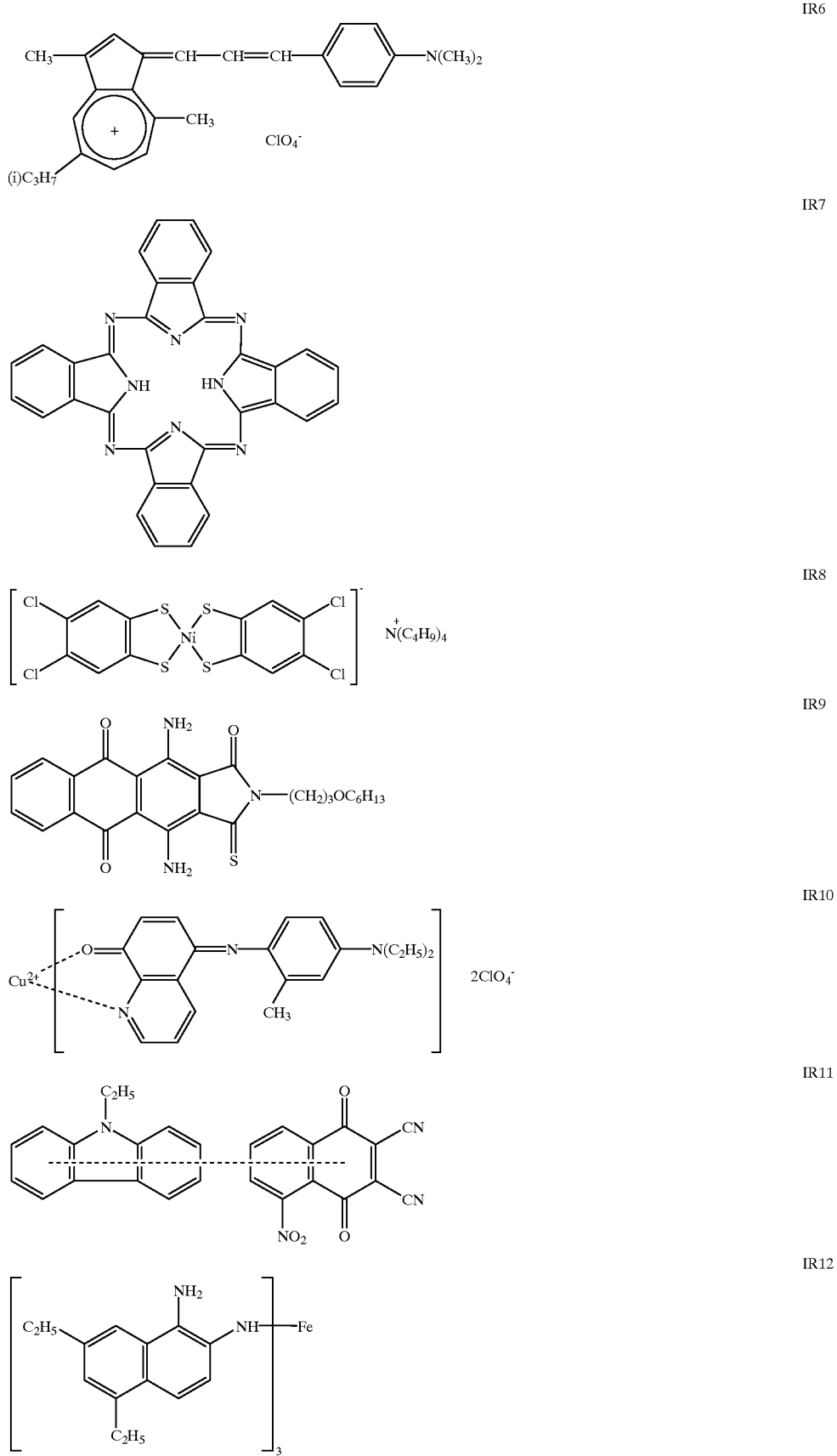
IR6
IR7
IR8
IR9
IR10
IR11
IR12

IR13
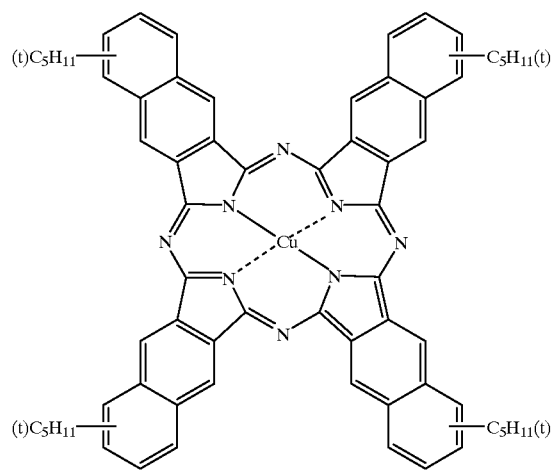
IR14
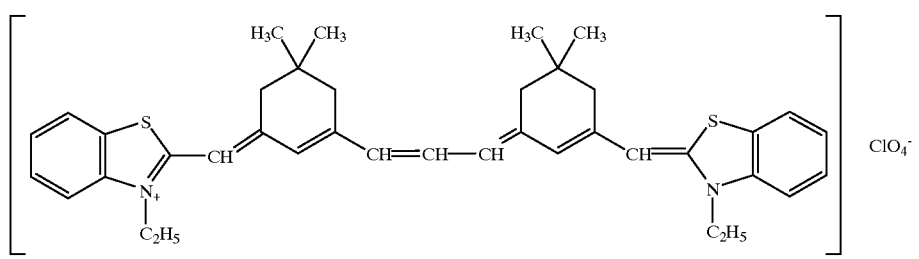
IR15
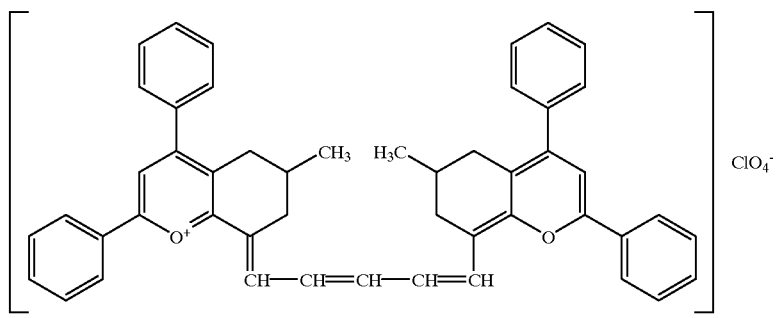
IR16
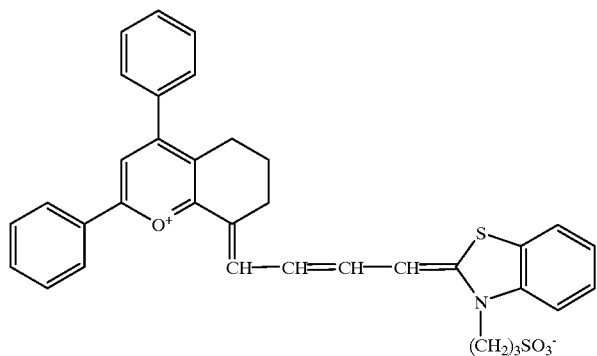

-continued
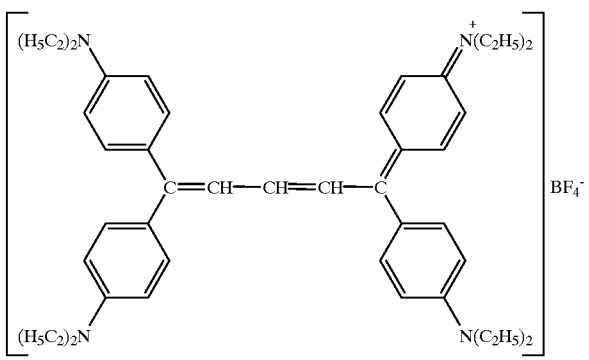
IR17
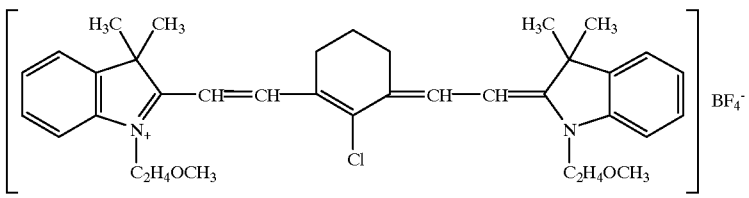
IR18
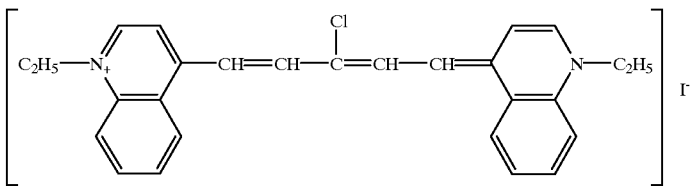
IR19
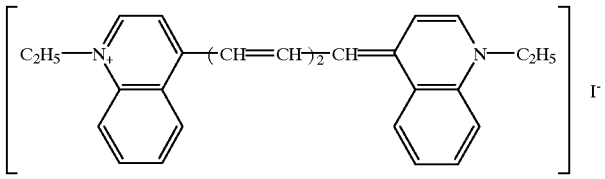
IR20
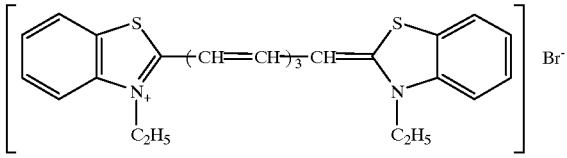
IR21
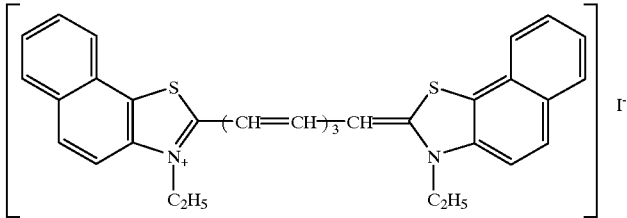
IR22
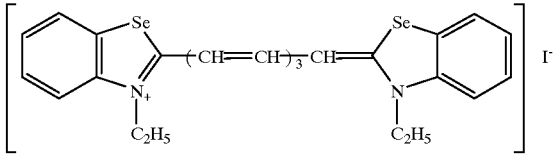
IR23

-continued
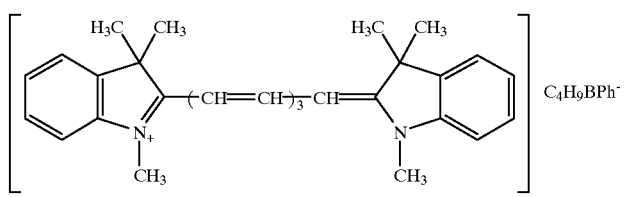 IR24
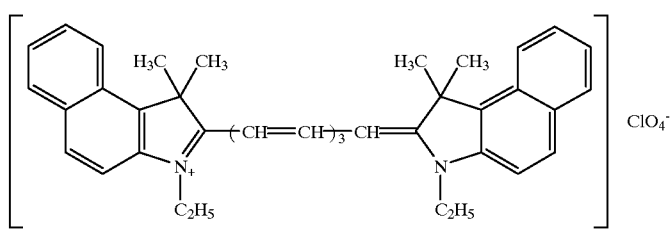 IR25
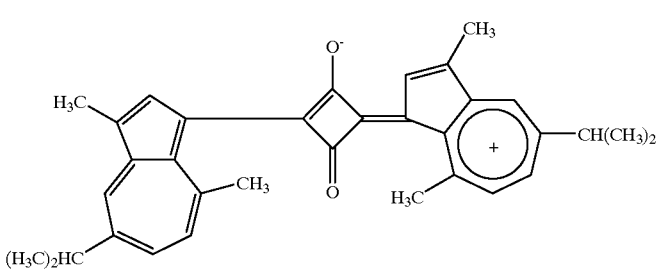 IR26
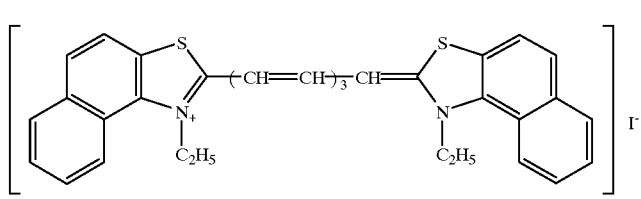 IR27
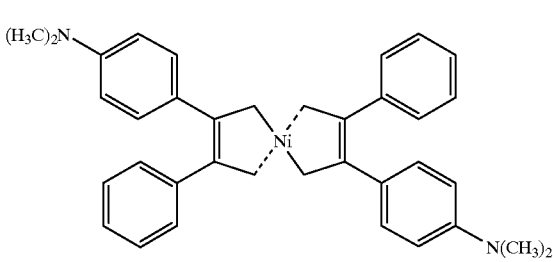 IR28
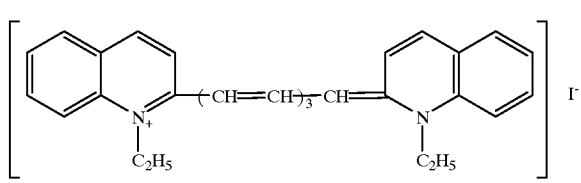 IR29
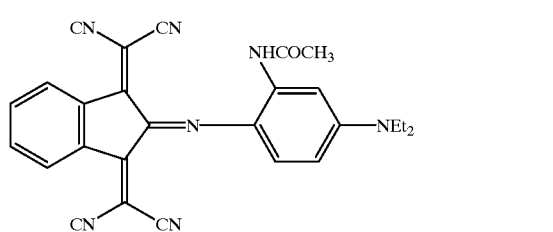 IR30

-continued
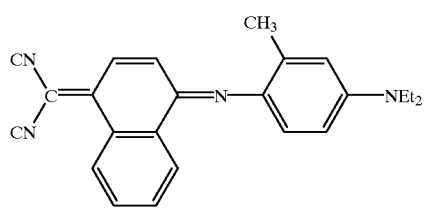
IR31
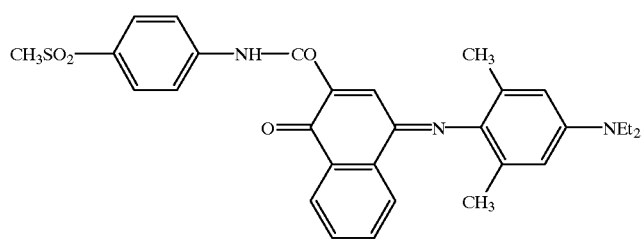
IR32
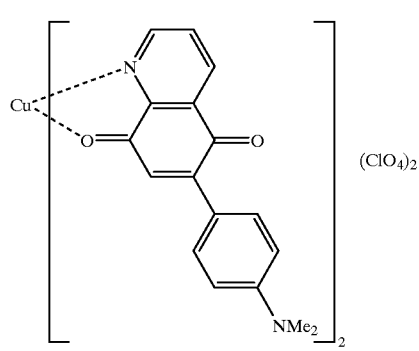
IR33
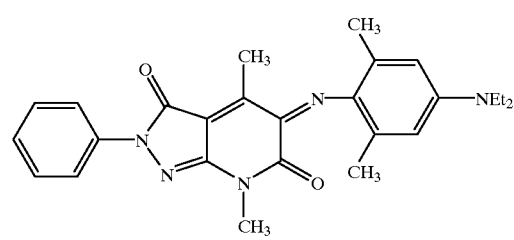
IR34
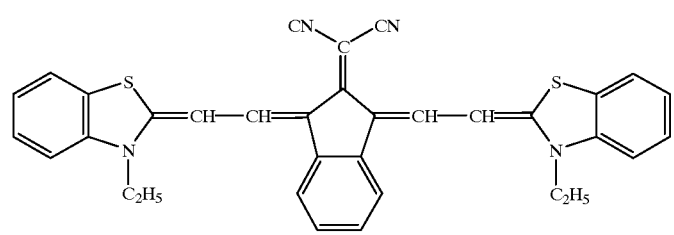
IR35
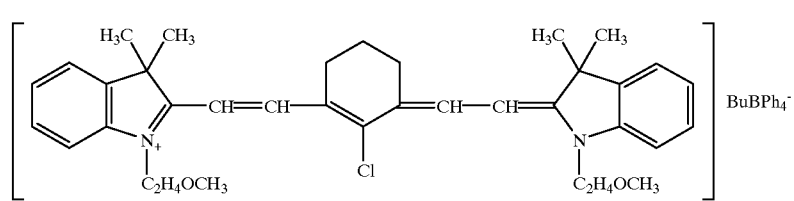
IR36

-continued
IR37
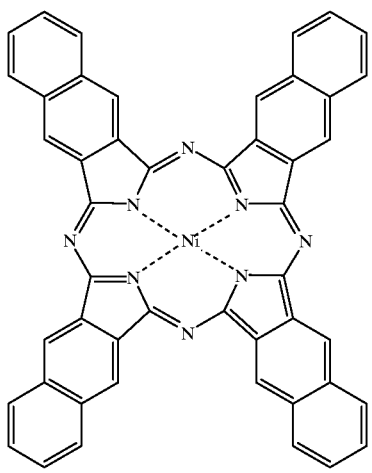
IR38
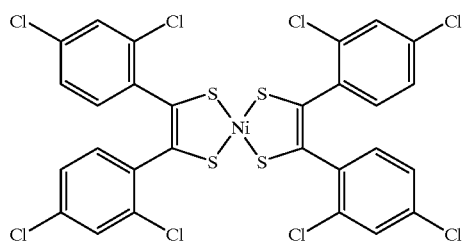
IR39
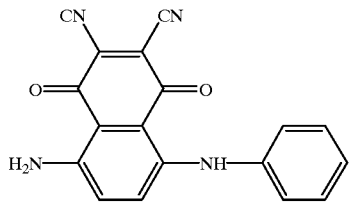
IR40
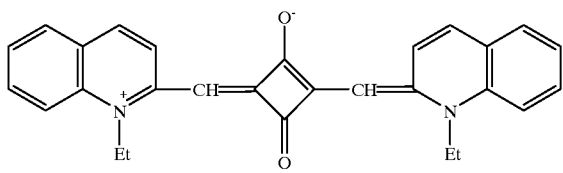
IR41
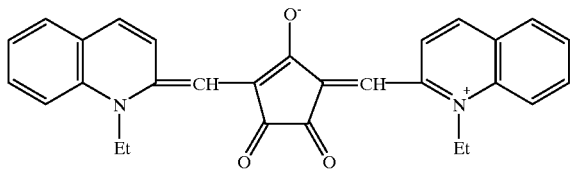
IR42
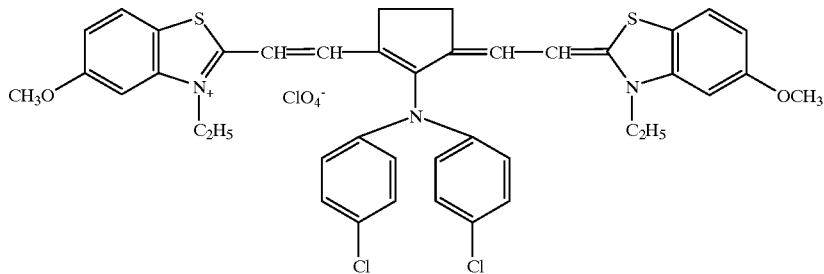

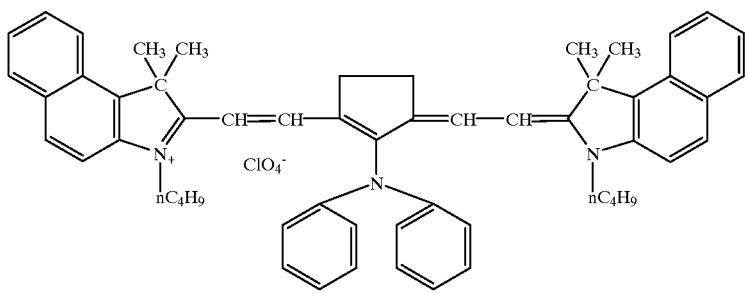
IR43
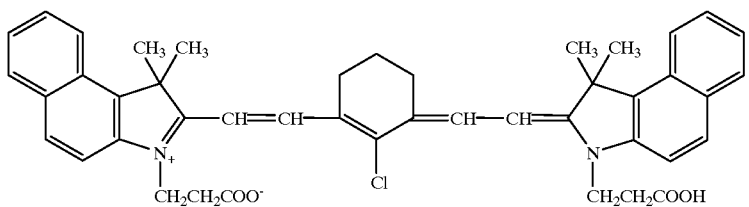
IR44
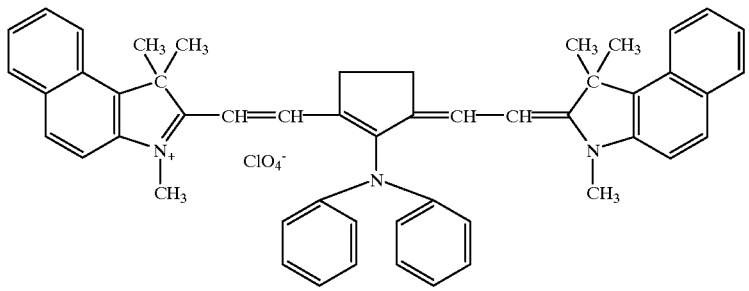
IR45
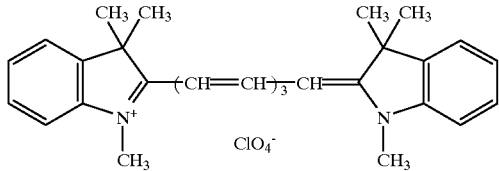
IR46
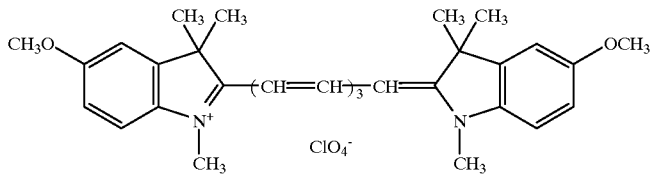
IR47
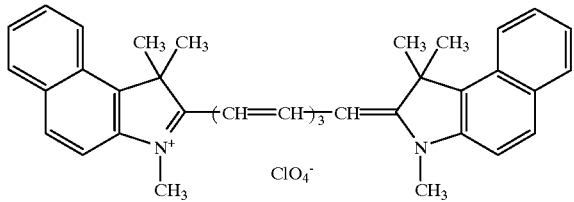
IR48

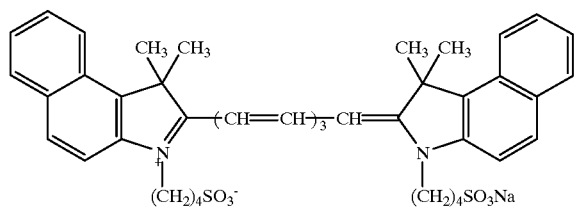
IR49
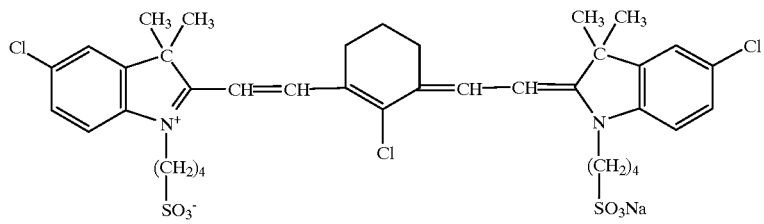
IR50
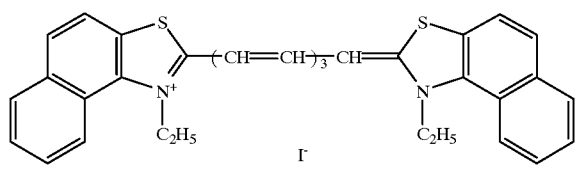
IR51
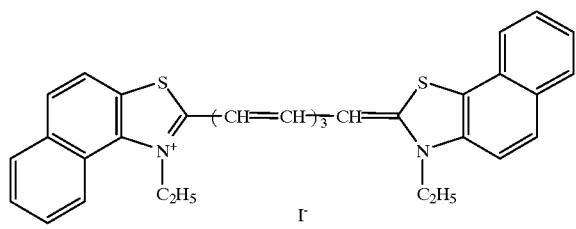
IR52
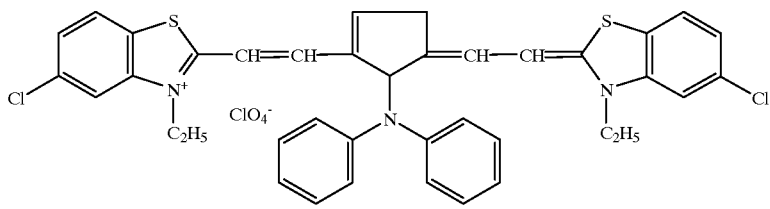
IR53
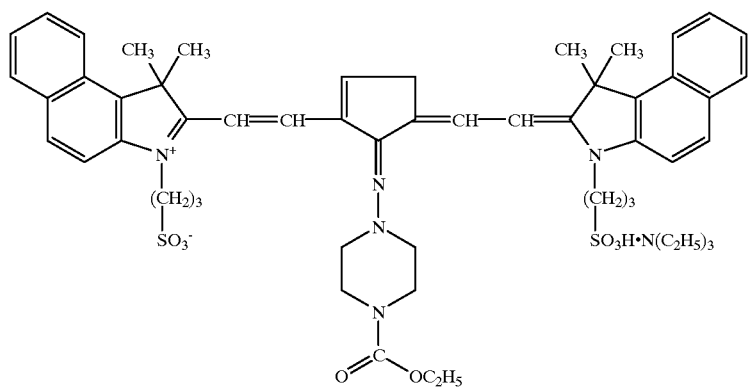
IR54

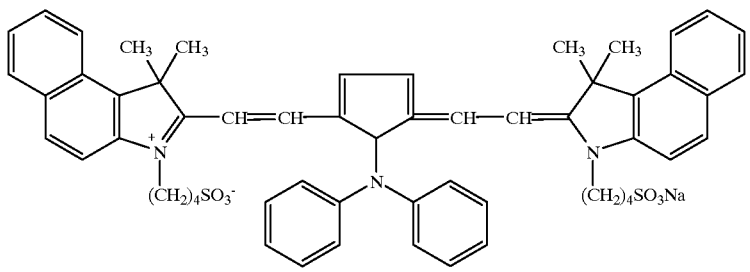

IR55

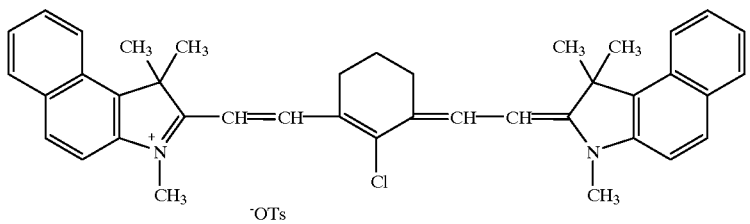

IR56

These dyes can be obtained by a conventional synthetic method, and the following commercially available dyes can be used:

IR750 (antraquinone type); IR002 and IR003 (aluminum type), IR820 (polymethine type); IRG022 and IRG033 (diimmonium type); CY-2, CY-4, CY-9 and CY-20, each produced by Nihon Kayaku Co., Ltd.;

KIR103 and SIR103 (phthalocyanine type); KIR101 and SIR114 (antraquinone type); PA1001, PA1005, PA1006 and SIR128, (metal complex type), each produced by Mitsui Toatsu Co., Ltd.;

Fastogen Blue 8120 produced by Dainihon Ink Kagaku Co., Ltd.; and

MIR-101,1011, and 1021 each produced by Midori Kagaku Co., Ltd.

Other infrared dyes are sold by Nihon Kankoshikiso Co., Ltd., Sumitomo Kagaku Co., Ltd. or Fuji Film Co., Ltd.

In the invention, the content of the infrared absorber is preferably 0.5 to 10% by weight based on the total weight of solid components of light sensitive layer.

(Solvent)

The solvent used in the invention will be explained below.

The solvent includes n-propanol, isopropyl alcohol, n-butanol, sec-butanol, isobutanol, 2-methyl-1-butanol, 3-methyl-1-butanol, 2-methyl-2-butanol, 2-ethyl-1-butanol, 1-pentanol, 2-pentanol, 3-pentanol, n-hexanol, 2-hexanol, cyclohexanol, methylcyclohexanol, 1-heptanol, 2-heptanol, 3-heptanol, 1-octanol, 4-methyl-2-pentanol, 2-hexylalcohol, benzyl alcohol, ethylene glycol, diethylene glycol, triethylene glycol, tetraethylene glycol, 1,3-propane diol, 1,5-pentane glycol, dimethyl triglycol, furfuryl alcohol, hexylene glycol, hexyl ether, 3-methoxy-1-methylbutanol, butyl phenyl ether, ethylene glycol monoacetate, propylene glycol monomethylether, propylene glycol monoethylether, propylene glycol monopropylether, propylene glycol monobutylether, propylene glycol phenylether, dipropylene glycol monomethylether, dipropylene glycol monoethylether, dipropylene glycol monopropylether, dipropylene glycol monombutylether, tripropylene glycol monomethylether, methyl carbitol, ethyl carbitol, ethyl carbitol acetate, butyl carbitol, triethylene glycol monomethylether, triethylene glycol monoethylether, tetraethylene glycol dimethylether, diacetone alcohol, acetophenone, cyclohexanone, methyl cyclohexanone, acetonylacetone, isophorone, methyl lactate, ethyl lactate, butyl lactate, propylene carbonate, phenyl acetate, sec-butyl acetate, cyclohexyl acetate, diethyl oxalate, methyl benzoate, ethyl benzoate, γ-butyrolactone, 3-methoxy-1-butanol, 4-methoxy-1-butanol, 3-ethoxy-1-butanol, 3-methoxy-3-methyl-1-butanol, 3-methoxy-3-ethyl-1-pentanol, 4-ethoxy-1-pentanol, 5-methoxy-1-hexanol, 4-hydroxy-2-pentanone, 5-hydroxy-2-pentanone, 6-hydroxy-2-pentanone, 4-hydroxy-3-pentanone, 6-hydroxy-2-hexanone, 3-methyl-3-hydroxy-2-pentanone, methyl cellosolve (MC), and ethyl cellosolve (EC). Further, the solvent includes allyl alcohol, isopropyl ether, butyl ether, anisole, propylene glycol monomethylether acetate, diethyl carbitol, tetrahydro furane, dioxane, dioxolane, acetone, methylpropyl ketone, methylethyl ketone, methylamyl ketone, diethyl ketone, ethylbutyl ketone, dipropyl ketone, diisobutyl ketone, 3-hydroxy-2-butanone, 4-hydroxy-2-butanone, 2-methoxyethyl acetate, 2-ethoxyethyl acetate, methoxybutyl acetate, methyl propionate, propyl propionate, methyl butyrate, ethyl butyrate, butyl butyrate, N-methyl-2-pyrrolidone, acetonitrile, dimethylformamide (DMF), dimethylacetoamide (DMAc), n-pentane, 2-methylpentane, 3-ethylpentane, methylcyclopentane, n-hexane, isohexane, cyclohexane, methylcyclohexane, n-heptane, cycloheptane, n-octane, isooctane, nonane, decane, benzene, toluene, o-xylene, m-xylene, p-xylene, ethylbenzene, o-diethylbenzene, m-diethylbenzene, p-diethylbenzene, cumene, n-amylbenzene, dimethyl diglycol (DMDG), and ethanol.

(Binder)

The light sensitive layer in the invention preferably contains a binder.

Polymers used as the binder include polyamide, polyester, polycarbonate, polystyrene, polyurethane, polyvinyl chloride or their copolymer, a polyvinyl butyral resin, a polyvinyl formal resin, shellac, an epoxy resin, a phenol resin, and an acryl resin.

The phenol resin includes a novolak resin, for example, a phenolformaldehyde resin, a cresolformaldehyde resin, a phenolcresolformaldehyde resin disclosed in Japanese Patent O.P.I. Publication No. 55-57841, and a polycondensation resin of a p-substituted phenol and phenol with formaldehyde or a polycondensation resin of cresol with formaldehyde disclosed in Japanese Patent O.P.I. Publication No. 55-127553.

The acryl resin includes a copolymer obtained by copolymerizing a mixture of monomers selected from the following monomers (1) through (17).

Another monomer, which is capable of being copolymerized with the following monomers, may be added to the mixture of the monomers above described. The copolymer may be a copolymer modified with glycidylacrylate or glycidylmethacrylate.

(1) A monomer having an aromatic hydroxy group, for example, o-hydroxystyrene, p-hydroxystyrene, m-hydroxystyrene, o-hydroxyphenylacrylate, p-hydroxyphenylacrylate, m-hydroxyphenylacrylate, (2) A monomer having an aliphatic hydroxy group, for example, 2-hydroxyethylacrylate, 2-hydroxyethylmethacrylate, N-methylolacrylamide, N-methylolmethacrylamide, 4-hydroxybutylacrylate, 4-hydroxybutylmethacrylate, 5-hydroxypentylacrylate, 5-hydroxypentylmethacrylate, 6-hydroxyhexylacrylate, 6-hydroxyhexylmethacrylate, N-(2-hydroxyethyl)acrylamide, N-(2-hydroxyethyl)methacrylamide, hydroxyethylvinyl ether, (3) A monomer having an aminosulfonyl group, for example, m-aminosulfonylphenyl methacrylate, p-aminosulfonylphenyl methacrylate, m-aminosulfonylphenyl acrylate, p-aminosulfonylphenyl acrylate, N-(p-aminosulfonylphenyl) methacrylamide, N-(p-aminosulfonylphenyl)acrylamide, (4) A monomer having a sulfonamido group, for example, N-(p-toluenesulfonyl)acrylamide, N-(p-toluenesulfonyl)-methacrylamide, (5) An α,β-unsaturated carboxylic acid, for example, acrylic acid, methacrylic acid, maleic acid, maleic anhydride, itaconic acid, itaconic anhydride, (6) A substituted or unsubstituted alkylacylate, for example, methylacrylate, ethylacrylate, propylacrylate, butylacrylate, amylacrylate, hexylacrylate, heptylacrylate, octylacrylate, nonylacrylate, decylacrylate, undecylacrylate, dodecylacrylate, benzylacrylate, cyclohexylacrylate, 2-chloroethylacrylate, N,N-dimethylaminoethylacrylate, glycidylacrylate, (7) A substituted or unsubstituted alkylmethacylate, for example, methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, benzylmethacrylate, cyclohexylmethacrylate, 2-chloroethylmethacrylate, N,N-dimethylaminoethylmethacrylate, glycidylmethacrylate, methacrylamide, (8) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, N-4-hydroxyphenylmethacrylamide, (9) A monomer having a fluorinated alkyl group, for example, trifluoroethylacrylate, trifluoroethylmrthacrylate, tetrafluoropropylacrylate, tetrafluoropropylmethacrylate, hexafluoropropylmethacrylate, octafluoropentylacrylate, octafluoropentylmethacrylate, heptadecafluorodecylacrylate, heptadecafluorodecylmethacrylate, N-butyl-N-(2-acryloxyethyl)heptadecafluorooctylsulfonamide,

(10) A vinyl ether, for example, ethylvinyl ether, 2-chloroethylvinyl ether, propylvinyl ether, butylvinyl ether, octylvinyl ether, phenylvinyl ether,

(11) A vinyl ester, for example, vinyl acetate, vinyl chroloacetate, vinyl butate, vinyl benzoate,

(12) A styrene, for example, styrene, methylstyrene, chloromethystyrene,

(13) A vinyl ketone, for example, methylvinyl ketone, ethylvinyl ketone, propylvinyl ketone, phenylvinyl ketone,

(14) An olefin, for example, ethylene, propylene, isobutylene, butadiene, isoprene,

(15) N-vinylpyrrolidone, N-vinylcarbazole, N-vinylpyridine,

(16) A monomer having a cyano group, for example, tacrylonitrile, metacrylonitrile, 2-pentenenitrile, 2-methyl-3-butene nitrile, 2-cyanoethylacrylate, o-cyanostyrene, m-cyanostyrene, p-cyanostyrene,

(17) A monomer having an amino group, for example, N,N-diethylaminoethylmethacrylate, N,N-dimethylaminoethylacrylate, N,N-dimethylaminoethylmethacrylate, polybutadiene urethaneacrylate, N,N-dimethylaminopropylacrylamide, N,N-dimethylacrylamide, acryloylmorpholine, N-isopropylacrylamide, N,N-diethylacrylamide, The weight average molecular weight of the above copolymers is preferably 10,000 to 200,000 measured by gel permeation chromatography (GPC), but is not limited thereto.

The binder content of the light sensitive layer in the invention is preferably 20 to 90 weight %, and more preferably 30 to 70 weight %.

The binder used in the light sensitive layer is preferably a mixutre of the novolak resin and the acryl resin. The acryl resin is preferably a polymer having a monomer unit from acrylic acid, methacrylic acid or their ester. In the mixture, the novolak resin content is preferably 20 to 80% by weight based on the solid components of the light sensitive layer, and the acryl resin content is preferably 1 to 50% by weight, and more preferably 5 to 30% by weight, based on the solid components of the light sensitive layer.

The light sensitive layer in the invention also preferably contains the novolak resin and a nonionic surfactant. The nonionic surfactant includes polyoxyethylene alkylether, polyoxyethylene alkylarylether, polyoxyethylene derivatives, oxyethylene-oxypropylene block polymer, sorbitan fatty acid ester, polyoxyethylene sorbitan fatty acid ester, polyoxyethylene sorbitol fatty acid ester, glycerin fatty acid ester, polyoxyethylene fatty acid ester, polyoxyethylene alkylamine, alkylalkanol amide, and polyethylene glycol. In this case, the novolak resin content is preferably 20 to 80% by weight based on the solid components of the light sensitive composition used, and the nonionic surfactant content is preferably 0.01 to 10% by weight, and more preferably 0.1 to 1.0% by weight, based on the solid components of the light sensitive composition used.

From the viewpoint of preventing occurrence of stains on non-image area in course of time, it is preferable that the light sensitive layer in the invention contains a fluorine-containing surfactant in an amount of 0.001 to 5 wt %.

As the fluorine-containing surfactant, the following compounds, for example, are given.

$C_7F_{15}CO_2NH_4$,
$C_8F_{17}SO_2N(C_2H_5)CH_2COOK$,
$C_8F_{17}SO_2NHC_3H_6N^+(CH_3)_2Cl^-$,
$C_7F_{15}CONH(CH_2)_3N^+(CH_3)_2C_2H_4COO^-$,
$C_8F_{17}SO_2N(C_2H_5)C_2H_4(OC_3H_6)_5OH$,
$C_7F_{15}CONHC_3H_6N^+(CH_3)_2(CH_2)_2COO^-$,

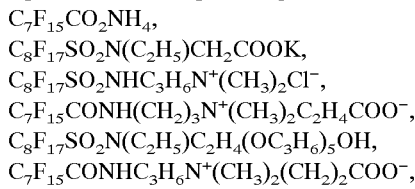

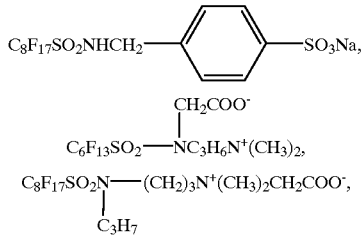

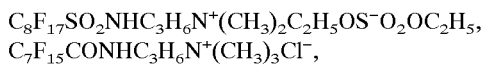

$C_8F_{17}SO_2NHC_3H_6N^+(CH_3)_2C_2H_5OS^-O_2OC_2H_5$,
$C_7F_{15}CONHC_3H_6N^+(CH_3)_3Cl^-$,

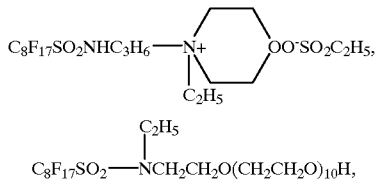

$C_8F_{17}SO_2N(CH_3)CH_2CH_2O_2CCH=CH_2$,

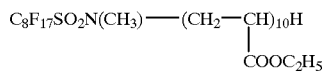

With regard to the fluorine-containing surfactant, it is also possible to use those available on the market, and examples of them include, Surfron "S-381", "S-382", "S-383", "SC-101", "SC-102", "SC-103", "SC-104" (each made by Asahi Glass Co.), Fluorad "FC-430" "FC-431", "FC-173" (each made by Fluorochemical-Sumitomo 3M Co.), Eftop "EF 352", "EF 301", "EF 303" (each made by Shin-Akita Kasei Co.), Schwegolfer "8035", "8036" (each made by Schwegman Co.), "BM1000", "BM1100" (each made by B.M. Hymie Co.), and Megafac "F-171", Megafac "F-177", Megafac "F-179" (each made by Dainihon Ink Kagaku Co.).

The fluorine-containing surfactant content of the light sensitive composition in the invention is preferably 0.05 to 2 wt %, and more preferably 0.1 to 1 wt %, based on the solid components of the light sensitive composition used. The fluorine-containing surfactant can be used either independently or in combination of two or more kinds thereof.

The light sensitive layer in the invention may contain a lipophilic resin to increase lipophilicity of the layer. The lipophilic resin includes a polycondensate of phenols with an alkyl group having 3 to 15 carbon atoms with aldehydes, for example, a t-butylphenol-formaldehyde resin disclosed in Japanese Patent O.P.I. Publication No. 50-125806/1975. The light sensitive layer in the invention may optionally contain dyes, pigment, sensitizers or visualizing agents other than the dyes described above.

The image forming material of the invention comprises the above described metal support and provided thereon, a light sensitive layer containing the light sensitive composition described above. The image forming material is obtained by dissolving the above described components in the solvent, coating the resulting light sensitive solution on the support, and drying to form a light sensitive layer. In the invention, the residual solvent content of the light sensitive layer is preferably 5 mg/m$^2$ or less, and more preferably 3 mg/m$^2$ or less.

In the invention, the image forming material of the invention is manufactured by coating the above described light sensitive solution on the above described metal support, and then drying the coated at 85° C. or more for 10 seconds or more, and preferably 90° C. or more for 30 seconds or more to form a light sensitive layer. The residual solvent content of the light sensitive layer is preferably 5 mg/m$^2$ or less.

The coating method includes conventional coating methods such as a whirler coating method, a wire-bar coating method, a dip coating method, an air-knife coating method, a blade coating method and a curtain coating method. The coating amount of the light sensitive layer in the presensitized planographic printing plate is preferably 0.5 to 5.0 g/m$^2$, although it varies depending on the usage.

(2) Image Forming Method

The image forming material of the invention is preferably imagewise exposed to light having a wavelength of 700 nm or more. The light source emitting such a light includes a semiconductor laser, a He—Ne laser, a YAG laser, and a carbon dioxide laser. The output power is suitably 50 mW or more, and preferably 100 mW or more.

The image forming material of the invention is developed with a developer, preferably an aqueous alkaline developer. The aqueous alkaline developer includes an aqueous solution containing an alkali metal salt such as sodium hydroxide, potassium hydroxide, sodium carbonate, potassium carbonate, sodium metasilicate, potassium metasilicate or di or trisodium phosphate. The metal salt concentration of the developer is preferably 0.05 to 20% by weight, and more preferably 0.1 to 10% by weight. The developer optionally contains an anionic surfactant, an amphoteric surfactant or an organic solvent such as alcohol. The organic solvent includes propylene glycol, ethylene glycol monophenylether, benzyl alcohol and n-propyl alcohol.

EXAMPLES

Next, the present invention will be explained in the examples. In the examples or comparative examples, all "parts" are by weight, unless otherwise specified.

Example 1

(Preparation of support 1)

A 0.24 mm thick aluminum plate (material 1050, quality H16) was degreased at 65° C. for one minute in a 5% sodium hydroxide solution, washed with water, neutralized in a 10% sulfuric acid solution at 25° C. for one minute and further washed with water. The resulting plate was electrolytically etched at 25° C. for 60 seconds at an alternating current density of 10 A/dm$^2$ in a 1.0% nitric acid solution, desmut at 60° C. for 10 seconds in a 5% sodium hydroxide solution, and then anodized at 20° C. for one minute at a current density of 3 A/dm$^2$ in a 20% sulfuric acid solution. The resulting aluminum plate was immersed at 80° C. for 30 seconds in a 1% ammonium acetate solution, washed with water and dried at 80° C. for 3 minutes. The resulting plate was further immersed at 85° C. for 30 seconds in a 0.1 weight % carboxymethyl cellulose (CMC) solution, and dried at 85° C. for 5 minutes to form a heat insulating layer.

The thickness of the heat insulating layer was 0.01 mg/m². Thus, support 1 was obtained.

(Synthesis of acid decomposable compound A)

A mixture of 0.5 mol of 1,1-dimethoxycyclohexane, 1.0 mol of 2-phenoxyethanol, 80 mg of p-toluene sulfonic acid, and 300 ml of toluene was reacted at 120° C. for 8 hours with stirring, while methanol produced during reaction was removed. The reaction mixture solution was cooled, washed with water, a sodium hydroxide solution, washed with an aqueous saturated sodium chloride solution to be neutralized, and dried over anhydrous potassium carbonate. The solvent of the resulting solution was removed by evaporation to obtain white crystals. Thus, an acid decomposable compound A represented by a formula described later was obtained.

(Preparation of light sensitive composition 1)

Light sensitive composition 1 having the following composition was prepared.

| | |
|---|---|
| * Binder A | 60.75 parts |
| Binder B (Molecular weight = 3800) | 15 parts |
| Acid decomposable compound A | 20 parts |
| Acid generating compound (Exemplified compound (1)) | 3 parts |
| Cyanine dye (Exemplified infrared absorber IR-25) | 1 part |
| Surfactant S-381 (produced by Asahi Glass Co. Ltd.) | 0.25 part |
| Solvent (PGM) | 1000 parts |

* Binder A: copolycondensate of phenol, m-cresol and p-cresol with formaldehyde, Mw = 3700 (phenol/ m-cresol/p-cresol = 5/57/38 by molar ratio)

Acid decomposable compound A

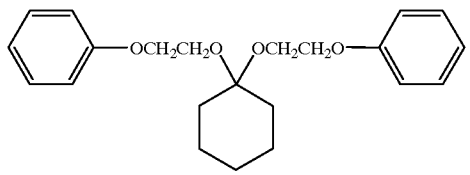

binder B (n:m:o:p=36.5:3.5:30:30, by molar ratio)

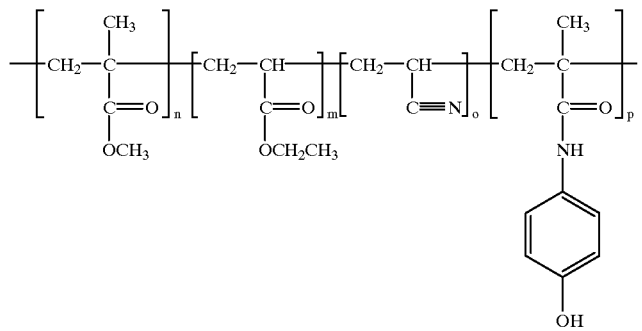

(Preparation of image forming material)

The above light sensitive composition 1 was coated on support 1 obtained above with a wire bar, and dried at 95° C. for 90 seconds to obtain a light sensitive layer (hereinafter referred to as light sensitive layer 1) with a dry thickness of 2.0 g/m². Thus, an image forming material sample (hereinafter referred to as presensitized planographic printing plate sample 1) was prepared.

Presensitized planographic printing plate sample 1 was imagewise exposed to a semiconductor laser (having a wavelength of 830 nm and an output of 500 mW). The laser light spot diameter was 13 μm at $1/e^2$ of the peak intensity. The resolving degree was 2,000 dpi in both the main and the sub scanning directions.

The exposed plate was developed at 30° C. for 30 seconds with developer, in which a planographic printing plate developer, SDR-1 (produced by Konica Corporation) was diluted 6 times by volume with water, to remove non-image portions (exposed portions), washed with water, and dried. Thus, printing plate 1 having a positive image was obtained.

Evaluation (Sensitivity)

Sensitivity was represented in terms of exposure energy (mJ/cm²) necessary to form an image when the presensitized planographic printing plate was exposed and then developed under the above conditions.

(Dot gain)

An optimal exposure condition was selected from data resulted from the above sensitivity tests of presensitized planographic printing plates. The above obtained presensitized planographic printing plate sample 1 was processed in the same manner as above, except that optimal exposure was carried out and dot images were formed. Employing the resulting printing plate, printing was carried out on a printing machine (DAIYA1F-1 produced by Mitsubishi Jukogyo Co., Ltd.), wherein a coated paper, dampening water, SG-51 (Concentration: 1.5%) produced by Tokyo Ink Co., Ltd., and printing ink (Hyplus M magenta produced by Toyo Ink Manufacturing Co., Ltd.) were used. Printing was carried out to give an image density of 1.6, and the dot on the printing matter at 50% dot area at 150 line/inch was measured for dot gain. Measurement was carried out using a Macbeth densitometer.

Example 2

Light sensitive composition 2 having the following composition was prepared.

(Preparation of light sensitive composition 2)

| | |
|---|---|
| Binder A | 50 parts |
| Binder B, Molecular weight = 3800 | 10 parts |

-continued

| | |
|---|---|
| Acid cross-linkable resin, resol resin Shonol CKP-918 (produced by Showa Kobunshi Co., Ltd.) | 35.75 parts |
| Acid generating compound (Exemplified compound (1)) | 3 parts |
| Cyanine dye (Exemplified infrared absorber IR-25) | 1 part |
| Surfactant S-381 (produced by Asahi Glass Co. Ltd.) | 0.25 part |
| Solvent (PGM) | 1000 parts |

(Preparation of image forming material)

The above light sensitive composition 2 was coated on Support 1 obtained, and dried in the same manner as in Example 1 to obtain a light sensitive layer (hereinafter referred to as light sensitive layer 2). Thus, an image forming material sample (hereinafter referred to as presensitized planographic printing plate sample 2) was prepared.

(Image forming)

Presensitized planographic printing plate sample 2 was imagewise exposed to a semiconductor laser (having a wavelength of 830 nm and an output of 500 mW). The laser light spot diameter was 13 $\mu$m at $1/e^2$ of the peak intensity. The resolving degree was 2,000 dpi in both the main and the sub scanning directions. The exposed plate was developed at 30° C. in 30 seconds with developer, in which a planographic printing plate developer, SDR-1 (produced by Konica Corporation) was diluted 6 times by volume with water, to remove non-image portions (unexposed portions), washed with water, and dried. Thus, printing plate 2 having a negative image was obtained. The developed plate 2 was evaluated in the same manner as in Example 1.

Examples 3 Through 20

Supports 2 through 5 were prepared in the same manner as in support 1 of Example 1, except that conditions as shown in Table 1 were employed. Supports 6 through 10 were prepared in the same manner as in support 1 of Example 1, except that conditions as shown in Table 1 were employed and the heat insulating layer was not provided. Further, presensitized planographic printing plate samples 3 through 20 were prepared in the same manner as in sample 1 of Example 1 or sample 2 of Example 2, except that supports 2 through 10 were used instead of support 1. The constitution of the resulting presensitized planographic printing plate samples 3 through 20 is also shown in Table 1. Samples 3 through 20 were processed and evaluated in the same manner as in Example 1. The results are shown in Table 2.

TABLE 1

| Sample No. | Light sensitive layer | Support | Elecrolytical etching conditions Current density (A/dm²) | Anodization conditions Current density (A/dm²) | Thickness of anodization layer (mg/dm²) | Material used in heat insulating layer | Thickness of heat insulating layer (mg/m²) | Surface energy γ (H) (dyn/cm) | Ra (μm) | Rz (μm) |
|---|---|---|---|---|---|---|---|---|---|---|
| 1 | 1 | 1 | 10 | 3 | 20 | CMC | 0.01 | 20.3 | 0.65 | 3.95 |
| 2 | 2 | 1 | 10 | 3 | 20 | CMC | 0.01 | 20.3 | 0.65 | 3.95 |
| 3 | 1 | 2 | 10 | 3 | 20 | Polyvinyl phosphonic acid | 0.01 | 24.7 | 0.65 | 3.95 |
| 4 | 2 | 2 | 10 | 3 | 20 | Polyvinyl phosphonic acid | 0.01 | 24.7 | 0.65 | 3.95 |
| 5 | 1 | 3 | 10 | 3 | 20 | CMC | 1 | 43.2 | 0.65 | 3.95 |
| 6 | 2 | 3 | 10 | 3 | 20 | CMC | 1 | 43.2 | 0.65 | 3.95 |
| 7 | 1 | 4 | 6 | 3 | 20 | CMC | 0.01 | 16.1 | 0.34 | 3.03 |
| 8 | 2 | 4 | 6 | 3 | 20 | CMC | 0.01 | 16.1 | 0.34 | 3.03 |
| 9 | 1 | 5 | 3 | 5 | 31 | CMC | 0.01 | 26.8 | 0.28 | 4.02 |
| 10 | 2 | 5 | 3 | 5 | 31 | CMC | 0.01 | 26.8 | 0.28 | 4.02 |
| 11 | 1 | 6 | 10 | 5 | 31 | None | 0 | 45.9 | 0.67 | 4.02 |
| 12 | 2 | 6 | 10 | 5 | 31 | None | 0 | 45.9 | 0.67 | 4.02 |
| 13 | 1 | 7 | 10 | 7 | 48 | None | 0 | 51.1 | 0.69 | 4.02 |
| 14 | 2 | 7 | 10 | 7 | 48 | None | 0 | 51.1 | 0.69 | 4.02 |
| 15 | 1 | 8 | 15 | 3 | 20 | None | 0 | 36.9 | 0.83 | 5.18 |
| 16 | 2 | 8 | 15 | 3 | 20 | None | 0 | 36.9 | 0.83 | 5.18 |
| 17 | 1 | 9 | 10 | 15 | 63 | None | 0 | 39.1 | 0.87 | 5.18 |
| 18 | 2 | 9 | 10 | 15 | 63 | None | 0 | 39.1 | 0.87 | 5.18 |
| 19 | 1 | 10 | 10 | 1 | 8 | None | 0 | 53.5 | 0.63 | 3.25 |
| 20 | 2 | 10 | 10 | 1 | 8 | None | 0 | 53.5 | 0.63 | 3.25 |

TABLE 2

| Sample No. | Sensitivity (mj/cm²) | Dot gain (%) |
|---|---|---|
| 1 | 200 | 23 |
| 2 | 200 | 22 |
| 3 | 250 | 19 |
| 4 | 200 | 17 |
| 5 | 300 | 24 |
| 6 | 300 | 22 |
| 7 | 150 | 26 |
| 8 | 150 | 25 |
| 9 | 100 | 28 |
| 10 | 120 | 29 |
| 11 | 250 | 30 |
| 12 | 250 | 28 |
| 13 | 200 | 26 |
| 14 | 300 | 24 |
| 15 | 400 | 47 |
| 16 | 400 | 42 |

TABLE 2-continued

| Sample No. | Sensitivity (mj/cm²) | Dot gain (%) |
|---|---|---|
| 17 | 100 | 45 |
| 18 | 100 | 41 |
| 19 | >500 | 20 |
| 20 | >500 | 29 |

As is apparent from Tables 1 and 2, the positive or negative working image forming material (presensitized planographic printing plate) according to the invention can form an image by infrared light exposure, and provides high sensitivity to infrared light, and a high quality image with reduced dot gain.

Examples 21 Through 36

The following supports were prepared.

(Preparation of support 11)

A 0.24 mm thick aluminum plate (material 1050, quality H16) was degreased at 65° C. for one minute in a 5% sodium hydroxide solution, washed with water, and then grained at a transport speed of 6 m/minute with an aqueous slurry of 20% stone powder as an abrasive agent, employing three graining brushes (made of nylon) driven by a 2.25 KW. The resulting plate was electrolytically etched at 20° C. for 10 seconds at an alternating current density of 20 A/dm² (quantity of electricity of 200 C) in a 2.5% hydrochloric acid solution, washed with water, desmut at 50° C. for 5 seconds in a 5% sodium hydroxide solution, neutralized with a 50% nitric acid solution, anodized at 20° C. for one minute at a current density of 3 A/dm² in a 20% sulfuric acid solution, washed with water and dried.

(Preparation of support 12)

A 0.24 mm thick aluminum plate (material 1050, quality H16) was degreased at 65° C. for one minute in a 5% sodium hydroxide solution, washed with water, and then grained at a transport speed of 6 m/minute with an aqueous slurry of 20% stone powder as an abrasive agent, employing three graining brushes (made of nylon) driven by a 2.25 KW. The resulting plate was electrolytically etched at 20° C. for 60 seconds at an alternating current density of 10 A/dm² in a 1.0 weight % nitric acid solution, desmut at 60° C. for 10 seconds in a 5% sodium hydroxide solution, and then neutralized with a 50% nitric acid solution, anodized at 20° C. for one minute at a current density of 3 A/dm² in a 20% sulfuric acid solution, washed with water and dried.

(Preparation of support 13)

A 0.24 mm thick aluminum plate (material 1050, quality H16) was degreased at 65° C. for one minute in a 5% sodium hydroxide solution, washed with water, and then grained at a transport speed of 6 m/minute with an aqueous slurry of 20% stone powder as an abrasive agent, employing three graining brushes (made of nylon) driven by a 2.25 KW. The resulting plate was electrolytically etched at 20° C. for 60 seconds at an alternating current density of 10 A/dm² in a 1.0 weight % nitric acid solution, desmut at 60° C. for 10 seconds in a 5% sodium hydroxide solution, then anodized at 20° C. for one minute at a current density of 3 A/dm² in a 20% sulfuric acid solution, washed with water and dried.

(Preparation of support 14)

A 0.24 mm thick aluminum plate (material 1050, quality H16) was degreased at 65° C. for one minute in a 5% sodium hydroxide solution, washed with water, and then grained at a transport speed of 6 m/minute with an aqueous slurry of 20% stone powder as an abrasive agent, employing three graining brushes (made of nylon) driven by a 2.25 KW. The resulting plate was electrolytically etched at 20° C. for 60 seconds at an alternating current density of 10 A/dm² in a 1.0 weight % nitric acid solution, desmut at 60° C. for 10 seconds in a 5% sodium hydroxide solution, and then anodized at 20° C. for one minute at a current density of 3 A/dm² in a 20% sulfuric acid solution. The anodized plate was immersed at 85° C. for 30 seconds in an aqueous 0.1 weight % polyvinyl phosphonic acid (hereinafter referred to as PVPA) solution, and then dried at 80° C. for 5 minutes. The thickness of the polyvinyl phosphonic acid heat insulating layer was 0.01 mg/m².

(Preparation of support 15)

A 0.24 mm thick aluminum plate (material 1050, quality H16) was grained with an aqueous slurry of 400 mesh pumice stone powder employing a brush (made of nylon), washed with water, etched at 70° C. for 60 seconds in a 10 weight % sodium hydroxide solution, washed with water, and neutralized with an aqueous 20% nitric acid solution. The resulting plate was electrolytically etched at Va=1.7 and 160 C/dm² employing a sine wave alternating current in a 1.0 weight % nitric acid solution, desmut at 55° C. for 2 minutes in an aqueous 30% sulfuric acid solution, and then anodized at 20° C. for 2 minutes at a current density of 2 A/dm² in a 20% sulfuric acid solution.

(Preparation of support 16)

A 0.24 mm thick aluminum plate (material 1050, quality H16) was degreased with trichloroethylene, grained with an aqueous slurry of 400 mesh pumice stone powder employing a brush (made of nylon), washed with water, and immersed at 45° C. for 10 seconds in an aqueous 25% sodium hydroxide solution, and washed with water. The resulting plate was anodized at a direct current density of 15 A/dm² in an aqueous 7% sulfuric acid solution to form an anodization layer, washed with water and dried.

(Preparation of support 17)

A 0.24 mm thick aluminum plate (material 1050, quality H16) was etched at 75° C. spraying an aqueous 26% potassium hydroxide solution, washed with water, desmut at 30° C. spraying an aqueous 1% hydrochloric acid, washed with water, electrolytically etched continuously at 35° C. in an aqueous 1% hydrochloric acid, applying a direct voltage under conditions of a direct voltage ripple ratio of 10%, a current density of 25 A/dm² and a quantity of electricity of 230 C/dm², and washed with water. The resulting plate was etched at 75° C. spraying an aqueous 26% potassium hydroxide solution, washed with water, desmut at 30° C. spraying an aqueous 1% nitric acid, washed with water, electrolytically etched continuously at 45° C. in an aqueous 1% nitric acid, applying an alternating voltage under conditions of a current density of 65 A/dm² and a quantity of electricity of 230 C/dm², and washed with water. The resulting plate was desmut at 75° C. spraying an aqueous 5% potassium hydroxide solution, washed with water, desmut at 60° C. spraying an aqueous 15% sulfuric acid solution, and washed with water. The resulting plate was anodized at 35° C. at a direct current density of 2 A/dm² in an aqueous 15% sulfuric acid solution, and washed with water to obtain support 17.

(Preparation of support 18)

A 0.24 mm thick aluminum plate (material 1050, quality H16) was etched at 75° C. spraying an aqueous 26% potassium hydroxide solution, washed with water, desmut at 30° C. spraying an aqueous 1% hydrochloric acid, washed with water, electrolytically etched continuously at 35° C. in an aqueous 1% hydrochloric acid, applying a direct voltage under conditions of a direct voltage ripple ratio of 10%, a current density of 25 A/dm² and a quantity of electricity of 230 C/dm², and washed with water. The resulting plate was etched at 75° C. spraying an aqueous 26% potassium hydroxide solution, washed with water, desmut at 30° C. spraying an aqueous 1% nitric acid solution, washed with water, electrolytically etched continuously at 45° C. in an aqueous 1% nitric acid solution, applying an alternating voltage under conditions of a current density of 65 A/dm² and a quantity of electricity of 230 C/dm², and washed with water. The resulting plate was etched at 75° C. spraying an aqueous 5% potassium hydroxide solution, washed with water, desmut at 60° C. spraying an aqueous 15% sulfuric acid solution, washed with water, anodized at 35° C. at a direct current density of 2 A/dm² in an aqueous 15% sulfuric acid solution, and washed with water. The anodized plate was immersed at 85° C. for 30 seconds in an aqueous 0.1 weight % PVPA solution, and then dried at 80° C. for 5 minutes to obtain support 18. (The thickness of the polyvinyl phosphonic acid heat insulating layer was 0.01 mg/m².)

(Synthesis of acid decomposable compound B)

A mixture of 57.68 g (0.4 mol) of cyclohexanonedimethylacetal, 42.45 g (0.4 mol) of diethylene glycol, 0.19 g (0.001 mol) of p-toluene sulfonic acid monohydrate and 200 ml of toluene was placed in a 500 ml three necked flask, and reacted under refluxing for 8 hours, while methanol produced during reaction and toluene were removed with a separator and toluene newly added every 20 minutes. The reaction mixture solution was cooled, washed with water, neutralized with a sodium hydroxide solution, and dried over anhydrous potassium carbonate. The solvent of the dried solution was removed by evaporation under reduced pressure to obtain a waxy compound. Thus, an acid decomposable compound B (molecular weight: 1200) was obtained. The yield was 72.1%.

Light sensitive composition 3 for a light sensitive layer 3 having the following composition was prepared.

(Preparation of light sensitive composition 3)

| | |
|---|---|
| Binder A | 60.75 parts |
| Binder B (Molecular weight = 3800) | 15 parts |
| Acid decomposable compound B | 20 parts |

-continued

| | |
|---|---|
| Acid generating compound (Exemplified compound (1)) | 3 parts |
| Cyanine dye (Exemplified infrared absorber IR-15) | 1 part |
| Surfactant S-381 (produced by Asahi Glass Co. Ltd.) | 0.25 part |
| Solvent (PGM) | 1000 parts |

Light sensitive composition 1 of Example 1 or above light sensitive composition 3 for light sensitive layer 3 was coated on each of supports 11 through 18 obtained above with a wire bar, and dried at 95° C. for 90 seconds to obtain a light sensitive layer with a dry thickness of 2.0 g/m². Thus, presensitized planographic printing plate samples 21 through 36 were obtained. Constitution of the supports employed are shown in Table 3.

The resulting presensitized planographic printing plates were imagewise exposed to a semiconductor laser (having a wavelength of 830 nm and an output of 500 mW). The laser light spot diameter was 13 μm at 1/e² of the peak intensity. The resolving degree was 2,000 dpi in both the main and the sub scanning directions. The exposed plate was developed at 30° C. in 30 seconds with developer, in which a planographic printing plate developer, SDR-1 (produced by Konica Corporation) was diluted 6 times by volume with water, to remove non-image portions (exposed portions), washed with water, and dried. Thus, printing plates having images were obtained.

The thus obtained images were evaluated in the same manner as in Example 1. The results are shown in Table 3. Samples 21 through 26 and samples 29 through 34 were those of Embodiment 1 of the invention, and samples 27, 28, 35 and 36 were those of Embodiment 2 of the invention.

TABLE 3

| Sample No. | Light sensitive layer No. | Support No. | Thickness of anodization layer (mg/dm²) | Ra (μm) | Rz (μm) | Material used in heat insulating layer | Thickness of heat insulating layer (mg/m²) | Surface energy γ (H) (dyn/cm) | Sensitivity (mj/cm²) | Dot gain (%) |
|---|---|---|---|---|---|---|---|---|---|---|
| 21 | 1 | 11 | 20 | 0.57 | 4.02 | — | 0 | 32.4 | 150 | 19 |
| 22 | 3 | 11 | 20 | 0.57 | 4.02 | — | 0 | 32.4 | 200 | 18 |
| 23 | 1 | 12 | 20 | 0.53 | 3.91 | — | 0 | 24.1 | 100 | 21 |
| 24 | 3 | 12 | 20 | 0.53 | 3.91 | — | 0 | 24.1 | 150 | 20 |
| 25 | 1 | 13 | 20 | 0.53 | 3.91 | — | 0 | 24.1 | 150 | 22 |
| 26 | 3 | 13 | 20 | 0.53 | 3.91 | — | 0 | 24.1 | 150 | 20 |
| 27 | 1 | 14 | 20 | 0.53 | 3.91 | PVPA | 0.01 | 30.1 | 250 | 26 |
| 28 | 3 | 14 | 20 | 0.53 | 3.91 | PVPA | 0.01 | 30.1 | 250 | 24 |
| 29 | 1 | 15 | 31 | 0.67 | 4.56 | — | 0 | 31.2 | 100 | 23 |
| 30 | 3 | 15 | 31 | 0.67 | 4.56 | — | 0 | 31.2 | 150 | 21 |
| 31 | 1 | 16 | 31 | 0.67 | 4.56 | — | 0 | 36.4 | 300 | 30 |
| 32 | 3 | 16 | 31 | 0.67 | 4.56 | — | 0 | 36.4 | 300 | 28 |
| 33 | 1 | 17 | 48 | 0.61 | 5.43 | — | 0 | 40.1 | 100 | 17 |
| 34 | 3 | 17 | 48 | 0.61 | 5.43 | — | 0 | 40.1 | 150 | 17 |
| 35 | 1 | 18 | 48 | 0.61 | 5.43 | PVPA | 0.01 | 49.3 | 200 | 24 |
| 36 | 3 | 18 | 48 | 0.61 | 5.43 | PVPA | 0.01 | 49.3 | 300 | 20 |

As is apparent from Table 3, the image forming material (presensitized planographic printing plate) according to the invention can form an image by infrared light exposure, and provides high sensitivity to infrared light, and a high quality image with reduced dot gain.

What is claimed is:

1. An image forming material comprising a metal support having an anodization layer on its surface, and provided on the anodization layer, a light sensitive layer containing a first compound capable of generating an acid on exposure of an actinic light, a third compound having a chemical bond capable of being decomposed by an acid, and an infrared absorber, wherein the thickness of the anodization layer is 10 to 60 mg/dm$^2$, and wherein the first compound is an organic halogen containing compound, or an onium salt selected from the group consisting of a salt of diazonium sulfonium or iodonium ion with $BF_4^-$, $PF_6^-$, $SbF_6^-$, $SiF_6^{2-}$, or $ClO_4^-$, the third compound is selected from the group consisting of acetal, ketal and silylether, and the infrared absorber is a cyanine dye according to formula (3) or (4) having an absorption peak in the wavelength range of 750 to 1200 nm,

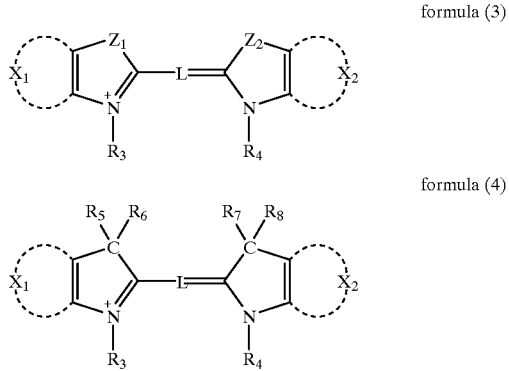

formula (3)

formula (4)

wherein $Z_1$ and $Z_2$ independently represent a sulfur atom, a selenium atom or an oxygen atom; $X_1$ and $X_2$ independently represent a non-metallic atomic group necessary to form a benzene or naphthalene ring, which may have a substituent; $R_3$ and $R_4$ independently represent a substituent, provided that one of $R_3$ and $R_4$ represents an anionic group, $R_5$, $R_6$, $R_7$ and $R_8$ independently represent a hydrogen atom, a halogen atom or an alkyl group having 1 to 3 carbon atoms; and L represents a linkage with a conjugated bond having 5 to 13 carbon atoms.

2. The image forming material of claim 1, wherein the thickness of the anodization layer is 20 to 50 mg/dm$^2$.

3. The image forming material of claim 1, wherein a heat insulating layer is provided between the light sensitive layer and the anodization layer, the heat insulating layer containing a water soluble polymer or a water soluble low molecular weight compound, wherein the thickness of the heat insulating layer is 0.001 to 10 mg/m$^2$.

4. The image forming material of claim 1, wherein the anodization layer of the metal support has a center line average surface roughness ($R_a$) of 0.3 to 0.7 μm, and has an average surface roughness ($R_z$) of 3.0 to 6.0 μm.

5. The image forming material of claim 1, wherein the surface energy, γ(H) of the anodization layer of the support is 15 to 50 dyn/cm, γ(H) being represented by the following equation:

γ(H)dyn/cm

=[{1.159+2.159×cos(contact angle of H$_2$O)—cos(contact angle of CH$_2$I$_2$)}/0.379]$^2$ wherein the contact angle of H$_2$O is a value obtained by being measured at 25° C. after 1.7 μl of H$_2$O are dripped on the surface, and the contact angle of CH$_2$I$_2$ is a value obtained by being measured at 25° C. after 1.3 μl of CH$_2$I$_2$ are dripped on the surface.

6. The image forming material of claim 1, wherein water retention amount on the anodization layer of the support is 2.0 to 6.0 ml/m$^2$.

7. The image forming material of claim 1, wherein the orthocarbonic acid ester, acetal, ketal or silylether further has —(CH$_2$CH$_2$O)$_n$— in its chemical structure in which n is an integer of 1 to 5.

8. The image forming material of claim 1, wherein, in the light sensitive layer, the content of the first compound is 0.1 to 20 weight %, the content of the third compound is 5 to 70 weight %, and the content of the infrared absorber is 0.5 to 10 weight %.

9. The image forming material of claim 1, wherein the metal support is an aluminum plate.

10. An image forming material comprising a metal support having an anodization layer with a thickness of 10 to 60 mg/dm$^2$ on its surface, and provided on the anodization layer, a heat insulating layer and a light sensitive layer in that order, the heat insulating layer having a thickness of 0.001 to 10 mg/m$^2$ and containing a water soluble polymer or a water soluble low molecular weight compound, and the light sensitive layer containing a first compound capable of generating an acid on exposure of an actinic light, a second compound having a group cross-linking by an acid, and an infrared absorber, wherein the first compound is an organic halogen containing compound, or an onium salt selected from the group consisting of a salt of diazonium, sulfonium, or iodonium ion with $BF_4^-$, $PF_6^-$, $SbF_6^-$, $SiF_6^{2-}$, or $ClO_4^-$, the second compound is selected from the group consisting of a compound having a methylol group or a methylol derivative group, a melamine resin, a furan resin, an isocyanate, and a blocked isocyanate, and the infrared absorber is a cyanine dye according to formula (3) or (4) having an absorption peak in the wavelength range of 750 to 1200 nm,

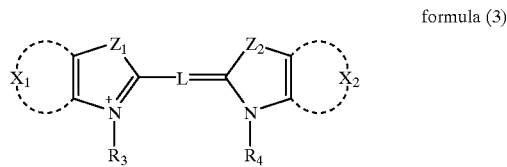

formula (3)

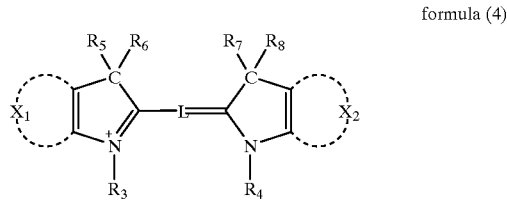

formula (4)

wherein $Z_1$ and $Z_2$ independently represent a sulfur atom, a selenium atom or an oxygen atom; $X_1$ and $X_2$ independently represent a non-metallic atomic group necessary to form a benzene or naphthalene ring, which may have a substituent; $R_3$ and $R_4$ independently represent a substituent, provided that one of $R_3$ and $R_4$ represents an anionic group, $R_5$, $R_6$, $R_7$ and $R_8$ independently represent a hydrogen atom, a halogen atom or an alkyl group having 1 to 3 carbon atoms; and L represents a linkage with a conjugated bond having 5 to 13 carbon atoms.

11. The image forming material of claim 10, wherein the thickness of the anodization layer is 20 to 50 mg/dm$^2$.

12. The image forming material of claim 10, wherein the anodization layer of the metal support has a center line average surface roughness ($R_a$) of 0.3 to 0.7 μm, and has an average surface roughness ($R_z$) of 3.0 to 6.0 μm.

13. The image forming material of claim 10, wherein the surface energy, γ(H) of the anodization layer of the support is 15 to 50 dyn/cm, γ(H) being represented by the following equation:

$$\gamma(H)\text{dyn/cm} = [\{1.159+2.159 \times \cos(\text{contact angle of } H_2O) - \cos(\text{contact angle of } CH_2I_2)\}/0.379]^2$$

wherein the contact angle of $H_2O$ is a value obtained by being measured at 25° C. after 1.7 µl of $H_2O$ are dripped on the surface, and the contact angle of $CH_2I_2$ is a value obtained by being measured at 25° C. after 1.3 µl of $CH_2I_2$ are dripped on the surface.

14. The image forming material of claim 10, wherein the water retention amount on the anodization layer of the support is 2.0 to 6.0 ml/m$^2$.

15. The image forming material of claim 10, wherein, in the light sensitive layer, the content of the first compound is 0.1 to 20 weight %, the content of the second compound is 1 to 80 weight %, and the content of the infrared absorber is 0.5 to 10 weight %.

16. The image forming material of claim 10, wherein the metal support is an aluminum plate.

* * * * *